US012633357B2

(12) United States Patent
Guo et al.

(10) Patent No.:     US 12,633,357 B2
(45) Date of Patent:         May 19, 2026

(54) STATE-DEPENDENT FAIL BIT COUNT CRITERIA FOR MEMORY APPARATUS PROGRAM PERFORMANCE GAIN

(71) Applicant: Sandisk Technologies, Inc., Milpitas, CA (US)

(72) Inventors: Jiacen Guo, Cupertino, CA (US); Xiang Yang, Santa Clara, CA (US); Henry Chin, San Jose, CA (US)

(73) Assignee: Sandisk Technologies, Inc., Milpitas, CA (US)

( * ) Notice:   Subject to any disclaimer, the term of this patent is extended or adjusted under 35 U.S.C. 154(b) by 337 days.

(21) Appl. No.: 18/231,368

(22) Filed:   Aug. 8, 2023

(65)   Prior Publication Data

US 2025/0054556 A1      Feb. 13, 2025

(51) Int. Cl.
*G11C 16/34*      (2006.01)
*G11C 16/04*      (2006.01)
*G11C 16/08*      (2006.01)
*G11C 16/10*      (2006.01)

(52) U.S. Cl.
CPC ...... *G11C 16/3459* (2013.01); *G11C 16/0483* (2013.01); *G11C 16/08* (2013.01); *G11C 16/10* (2013.01)

(58) Field of Classification Search
CPC ................................ G11C 16/10; G11C 16/08
See application file for complete search history.

(56)   References Cited

U.S. PATENT DOCUMENTS

| | | | |
|---|---|---|---|
| 9,013,928 B1 | 4/2015 | Dutta et al. | |
| 9,570,179 B2 | 2/2017 | Tseng et al. | |
| 11,450,393 B1 | 9/2022 | Prakash et al. | |
| 2023/0307072 A1* | 9/2023 | Masuduzzaman ..... | G11C 16/10 |
| 2023/0402110 A1* | 12/2023 | Zhang ................... | G11C 16/24 |
| 2024/0404607 A1* | 12/2024 | Liu ........................ | G11C 16/26 |

OTHER PUBLICATIONS

U.S. Appl. No. 63/466,875, Smart Early Program Termination Algorithmdisturb Countermeasure, Dandan Yi et al., filed May 16, 2023.

* cited by examiner

*Primary Examiner* — Hoai V Ho
*Assistant Examiner* — Anthony Thinh Tang
(74) *Attorney, Agent, or Firm* — Dickinson Wright PLLC

(57)   ABSTRACT

A memory apparatus and method of operation are provided. The apparatus includes memory cells connected to word lines and configured to retain a threshold voltage corresponding to data states. A control means applies verification pulses of program verify voltages each associated with one of the data states to selected ones of the word lines and counts the memory cells having the threshold voltage below each of the program verify voltages targeted for each of the memory cells being programmed during each of a plurality of verify loops of a program-verify operation. The control means terminates the plurality of verify loops for the memory cells targeted for one of the data states in response to the count of the memory cells exceeding a predetermined count threshold. The predetermined count threshold is different for at least one of the data states compared to other ones of the data states.

20 Claims, 22 Drawing Sheets

APPLYING VERIFICATION PULSES OF A PLURALITY OF PROGRAM VERIFY VOLTAGES EACH ASSOCIATED WITH ONE OF THE PLURALITY OF DATA STATES TO SELECTED ONES OF THE PLURALITY OF WORD LINES AND COUNTING THE MEMORY CELLS HAVING THE THRESHOLD VOLTAGE BELOW EACH OF THE PLURALITY OF PROGRAM VERIFY VOLTAGES TARGETED FOR EACH OF THE MEMORY CELLS BEING PROGRAMMED DURING EACH OF A PLURALITY OF VERIFY LOOPS OF A PROGRAM-VERIFY OPERATION

2000

TERMINATING THE PLURALITY OF VERIFY LOOPS FOR THE MEMORY CELLS TARGETED FOR ONE OF THE PLURALITY OF DATA STATES IN RESPONSE TO THE COUNT OF THE MEMORY CELLS TARGETED FOR THE ONE OF THE PLURALITY OF DATA STATES BEING GREATER THAN OR EQUAL TO A PREDETERMINED COUNT THRESHOLD, THE PREDETERMINED COUNT THRESHOLD BEING DIFFERENT FOR AT LEAST ONE OF THE PLURALITY OF DATA STATES COMPARED TO THE PREDETERMINED COUNT THRESHOLD FOR OTHER ONES OF THE PLURALITY OF DATA STATES

2002

|              | S0 | S1 | S2 | S3 | S4 | S5 | S6 | S7 |
|--------------|----|----|----|----|----|----|----|----|
| Upper Page   | 1  | 1  | 1  | 0  | 0  | 0  | 0  | 1  |
| Middle Page  | 1  | 1  | 0  | 0  | 1  | 1  | 0  | 0  |
| Lower Page   | 1  | 0  | 0  | 0  | 0  | 1  | 1  | 1  |

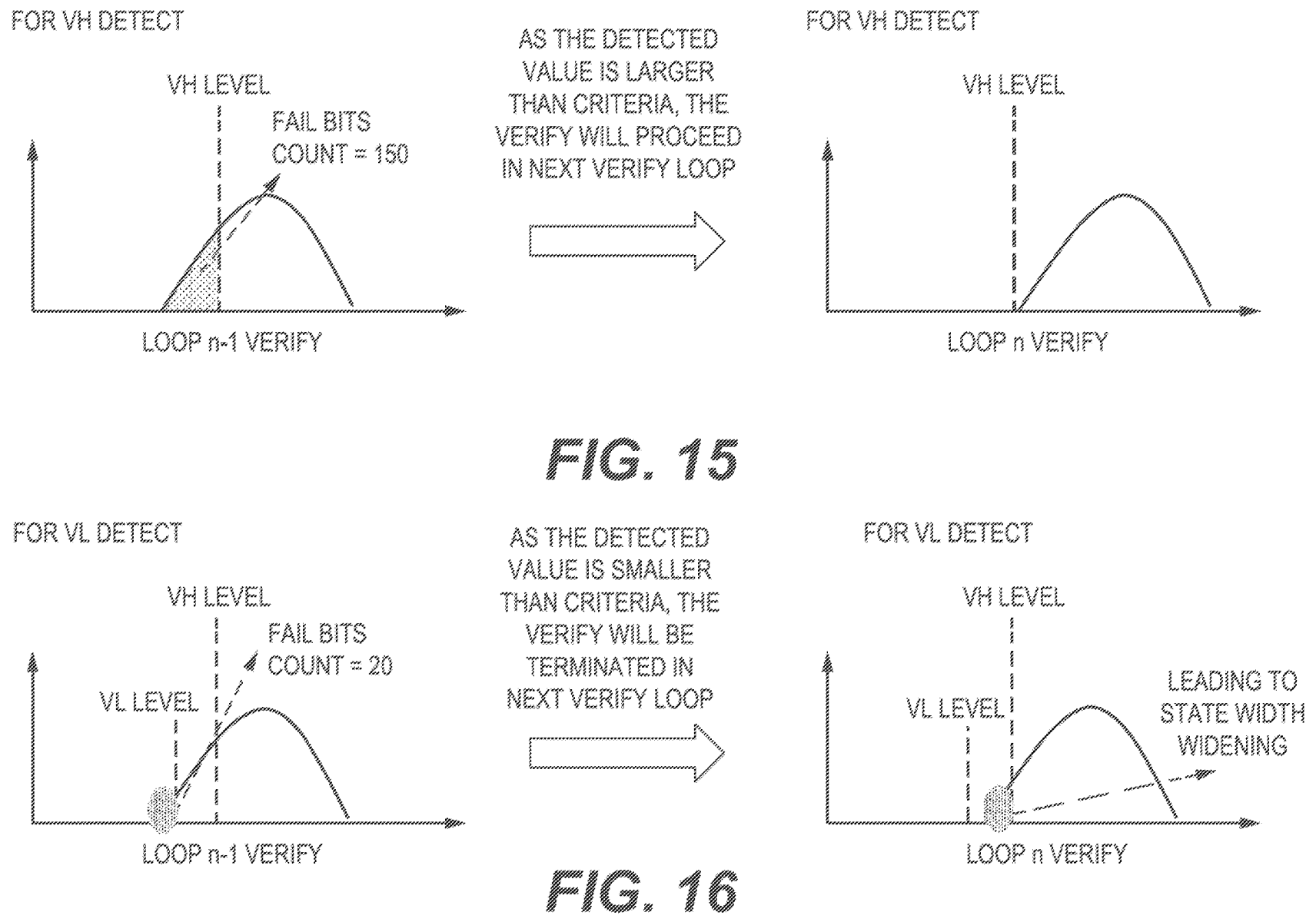

FOR VH DETECT

VH LEVEL

LOOP n VERIFY

AS THE DETECTED VALUE IS LARGER THAN CRITERIA, THE VERIFY WILL PROCEED IN NEXT VERIFY LOOP

FOR VH DETECT

VH LEVEL

FAIL BITS COUNT = 150

LOOP n-1 VERIFY

FIG. 15

FOR VL DETECT

VH LEVEL

VL LEVEL

LOOP n VERIFY

LEADING TO STATE WIDTH WIDENING

AS THE DETECTED VALUE IS SMALLER THAN CRITERIA, THE VERIFY WILL BE TERMINATED IN NEXT VERIFY LOOP

FOR VL DETECT

VH LEVEL

FAIL BITS COUNT = 20

VL LEVEL

LOOP n-1 VERIFY

FIG. 16

Figure 20:
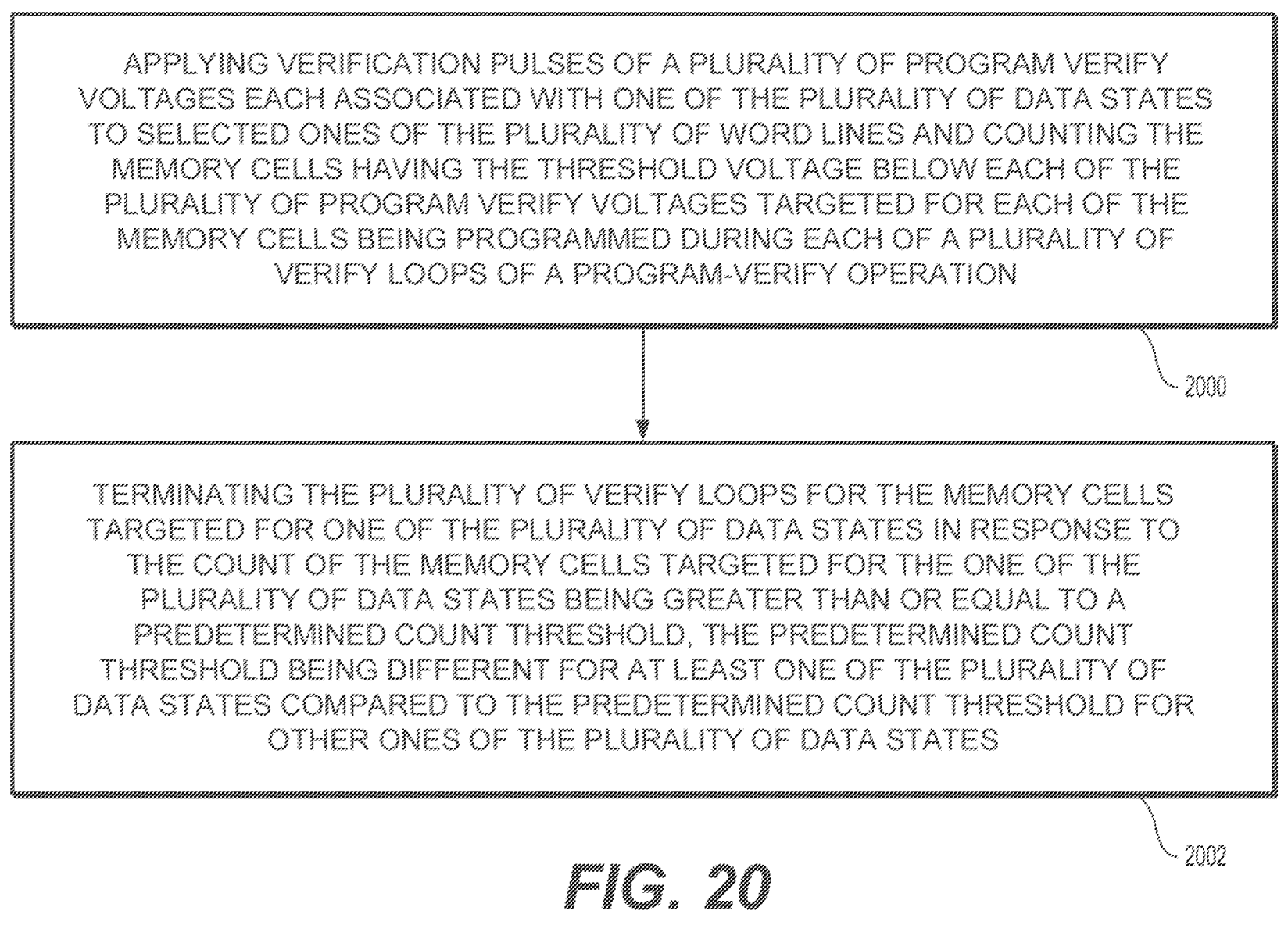

APPLYING VERIFICATION PULSES OF A PLURALITY OF PROGRAM VERIFY VOLTAGES EACH ASSOCIATED WITH ONE OF THE PLURALITY OF DATA STATES TO SELECTED ONES OF THE PLURALITY OF WORD LINES AND COUNTING THE MEMORY CELLS HAVING THE THRESHOLD VOLTAGE BELOW EACH OF THE PLURALITY OF PROGRAM VERIFY VOLTAGES TARGETED FOR EACH OF THE MEMORY CELLS BEING PROGRAMMED DURING EACH OF A PLURALITY OF VERIFY LOOPS OF A PROGRAM-VERIFY OPERATION

2000

TERMINATING THE PLURALITY OF VERIFY LOOPS FOR THE MEMORY CELLS TARGETED FOR ONE OF THE PLURALITY OF DATA STATES IN RESPONSE TO THE COUNT OF THE MEMORY CELLS TARGETED FOR THE ONE OF THE PLURALITY OF DATA STATES BEING GREATER THAN OR EQUAL TO A PREDETERMINED COUNT THRESHOLD, THE PREDETERMINED COUNT THRESHOLD BEING DIFFERENT FOR AT LEAST ONE OF THE PLURALITY OF DATA STATES COMPARED TO THE PREDETERMINED COUNT THRESHOLD FOR OTHER ONES OF THE PLURALITY OF DATA STATES

STATE-DEPENDENT FAIL BIT COUNT CRITERIA FOR MEMORY APPARATUS PROGRAM PERFORMANCE GAIN

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, during programming of the memory cells, the memory cells may be verified based on one or more verify levels. There are typically tradeoffs between threshold voltage budget and programming performance when selecting the verify levels. Thus, there is a need for improved memory apparatuses and methods of operation that overcome such challenges.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines and configured to retain a threshold voltage corresponding to one of a plurality of data states. A control means is coupled to the plurality of word lines and is configured to apply verification pulses of a plurality of program verify voltages each associated with one of the plurality of data states to selected ones of the plurality of word lines and count the memory cells having the threshold voltage below each of the plurality of program verify voltages targeted for each of the memory cells being programmed during each of a plurality of verify loops of a program-verify operation. The control means is also configured to terminate the plurality of verify loops for the memory cells targeted for one of the plurality of data states in response to the count of the memory cells targeted for the one of the plurality of data states being greater than or equal to a predetermined count threshold. The predetermined count threshold is different for at least one of the plurality of data states compared to the predetermined count threshold for other ones of the plurality of data states.

According to another aspect of the disclosure, a controller in communication with a memory apparatus including memory cells each connected to one of a plurality of word lines is provided. The memory cells are configured to retain a threshold voltage corresponding to one of a plurality of data states. The controller is configured to instruct the memory apparatus to instruct the memory apparatus to apply verification pulses of a plurality of program verify voltages each associated with one of the plurality of data states to selected ones of the plurality of word lines and count the memory cells having the threshold voltage below each of the plurality of program verify voltages targeted for each of the memory cells being programmed during each of a plurality of verify loops of a program-verify operation. The controller is also configured to instruct the memory apparatus to terminate the plurality of verify loops for the memory cells targeted for one of the plurality of data states in response to the count of the memory cells targeted for the one of the plurality of data states being greater than or equal to a predetermined count threshold. The predetermined count threshold is different for at least one of the plurality of data states compared to the predetermined count threshold for other ones of the plurality of data states.

According to an additional aspect of the disclosure, a method of operating a memory apparatus is provided. The memory apparatus includes memory cells each connected to one of a plurality of word lines and configured to retain a threshold voltage corresponding to one of a plurality of data states. The method includes the step of applying verification pulses of a plurality of program verify voltages each associated with one of the plurality of data states to selected ones of the plurality of word lines and counting the memory cells having the threshold voltage below each of the plurality of program verify voltages targeted for each of the memory cells being programmed during each of a plurality of verify loops of a program-verify operation. The method also includes the step of terminating the plurality of verify loops for the memory cells targeted for one of the plurality of data states in response to the count of the memory cells targeted for the one of the plurality of data states being greater than or equal to a predetermined count threshold. The predetermined count threshold is different for at least one of the plurality of data states compared to the predetermined count threshold for other ones of the plurality of data states.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 15 shows plots of the threshold voltage of memory cells along with the fail bits count using a verify high program verify voltage during two sequential loops or iterations of the program-verify operation according to aspects of the disclosure;

FIG. 16 shows plots of the threshold voltage of memory cells along with a fail bits count using a verify low program verify voltage during two sequential loops or iterations of the program-verify operation according to aspects of the disclosure;

Figure 19:
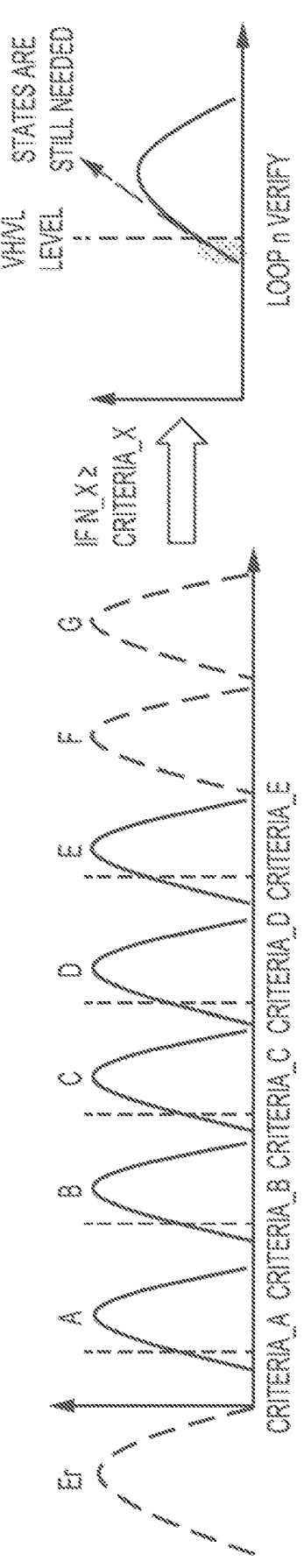

FIG. 19 is a plot of threshold voltage distributions for memory cells each configured to store three bits for a plurality of data states along with the predetermined count threshold for various ones of the plurality of data states and an example verify iteration according to aspects of the disclosure; and FIG. 20 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

Figure 9:
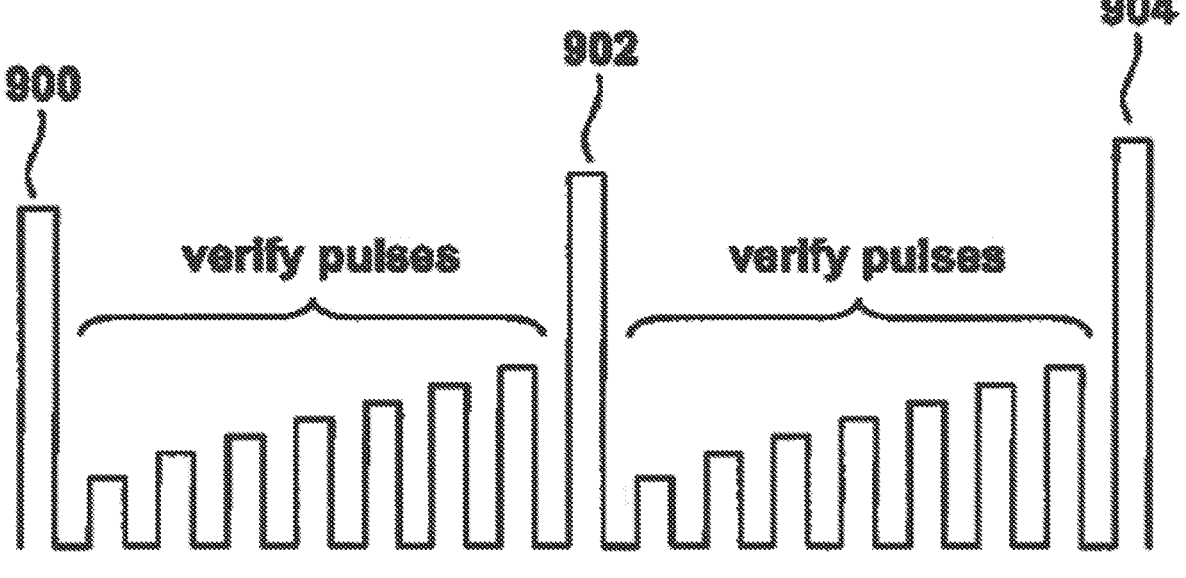
FIG. 9 depicts a word line voltage during programming and verify operations according to aspects of the disclosure.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify or program-verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased or S0 state and seven higher data states referred to as the S1, S2, S3, S4, S5, S6, S7 data states (see FIG. 5) or the erased state Er and seven higher data states referred to as the A, B, C, D, E, F, G states (see FIGS. 18 and 19). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

For the program-verify operations, a verify low program verify voltage VL and a verify high program verify voltage VH can be associated with each of the data states. So, either the verify low program verify voltage VL or the verify high program verify voltage VH may be used to determine whether a verify for one of the data states should be termination, based on a count of the number of memory cells remaining below either the verify low program verify voltage VL or the verify high program verify voltage VH. Tradeoffs exist between threshold voltage budget and programming performance when using the verify low program verify voltage VL or the verify high program verify voltage VH for the program-verify operation.

Figure 1:
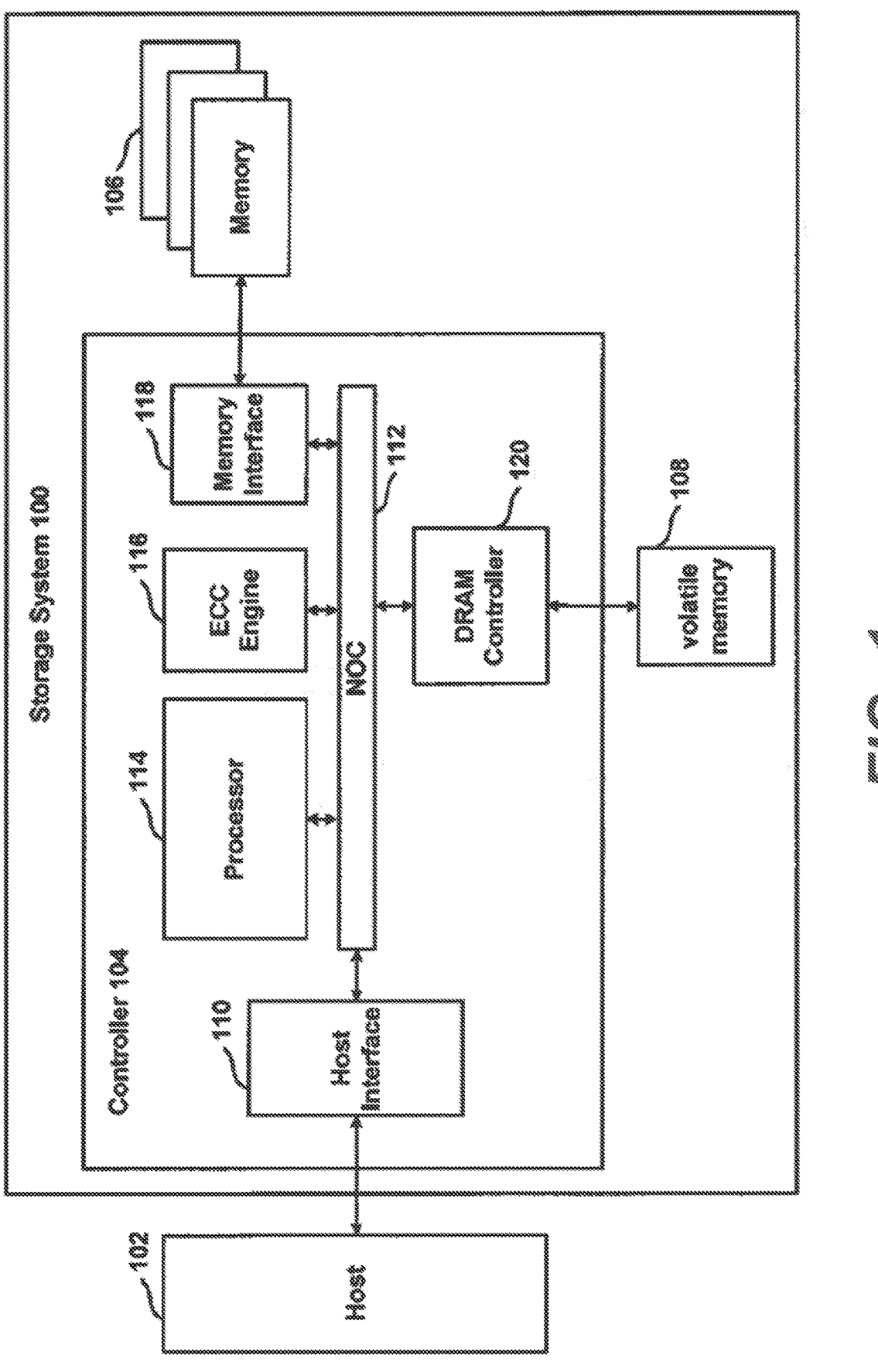
FIG. 1 is a block diagram depicting one embodiment of a memory system according to aspects of the disclosure.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables").

Controller 104 includes a host interface 110 that is connected to and in communication with host 102. In one embodiment, host interface 110 provides a PCIe interface. Other interfaces can also be used, such as SCSI, SATA, etc.

Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
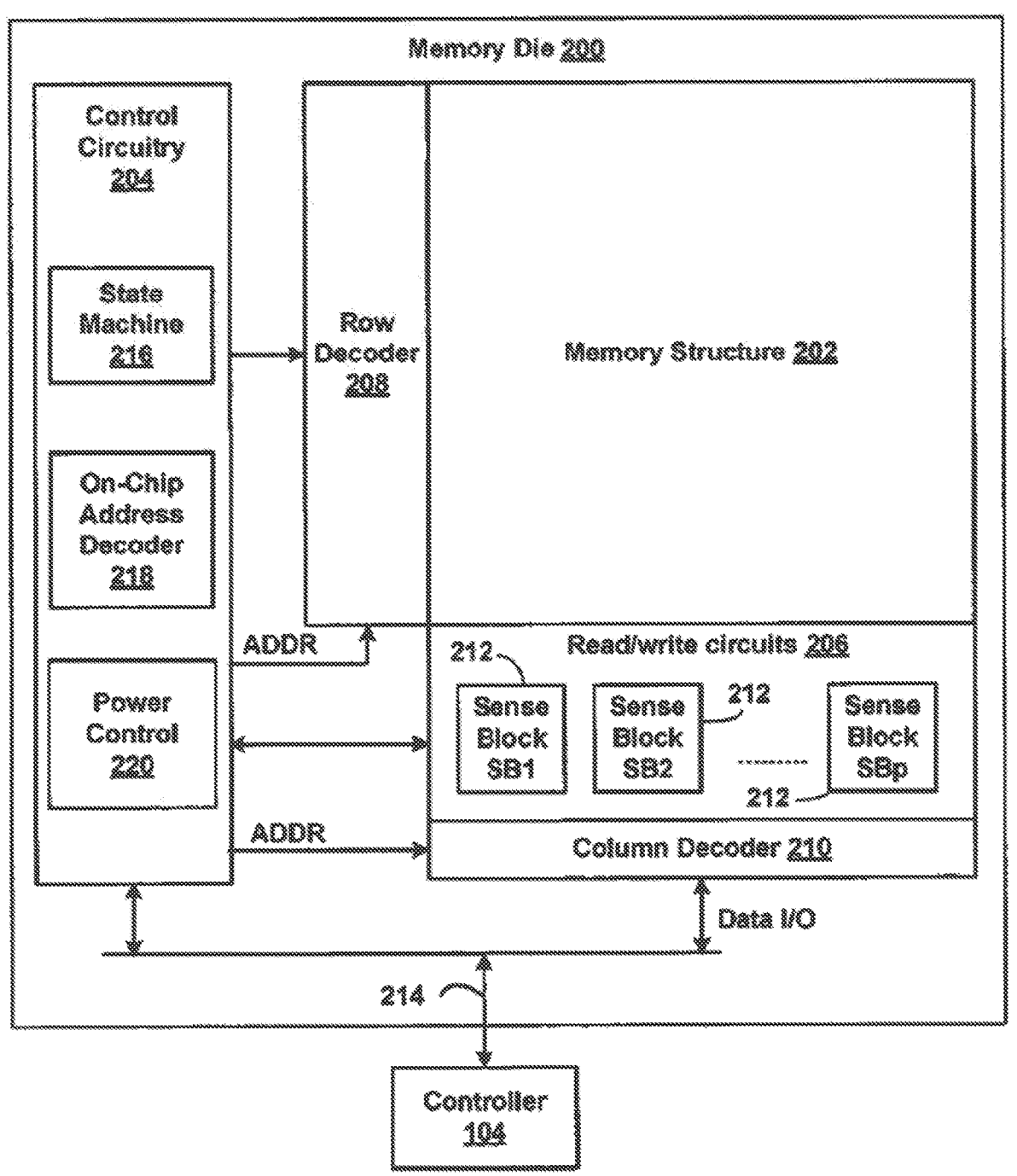
FIG. 2 is a block diagram of one embodiment of a memory die according to aspects of the disclosure.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, and a power control circuit 220. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe— $Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
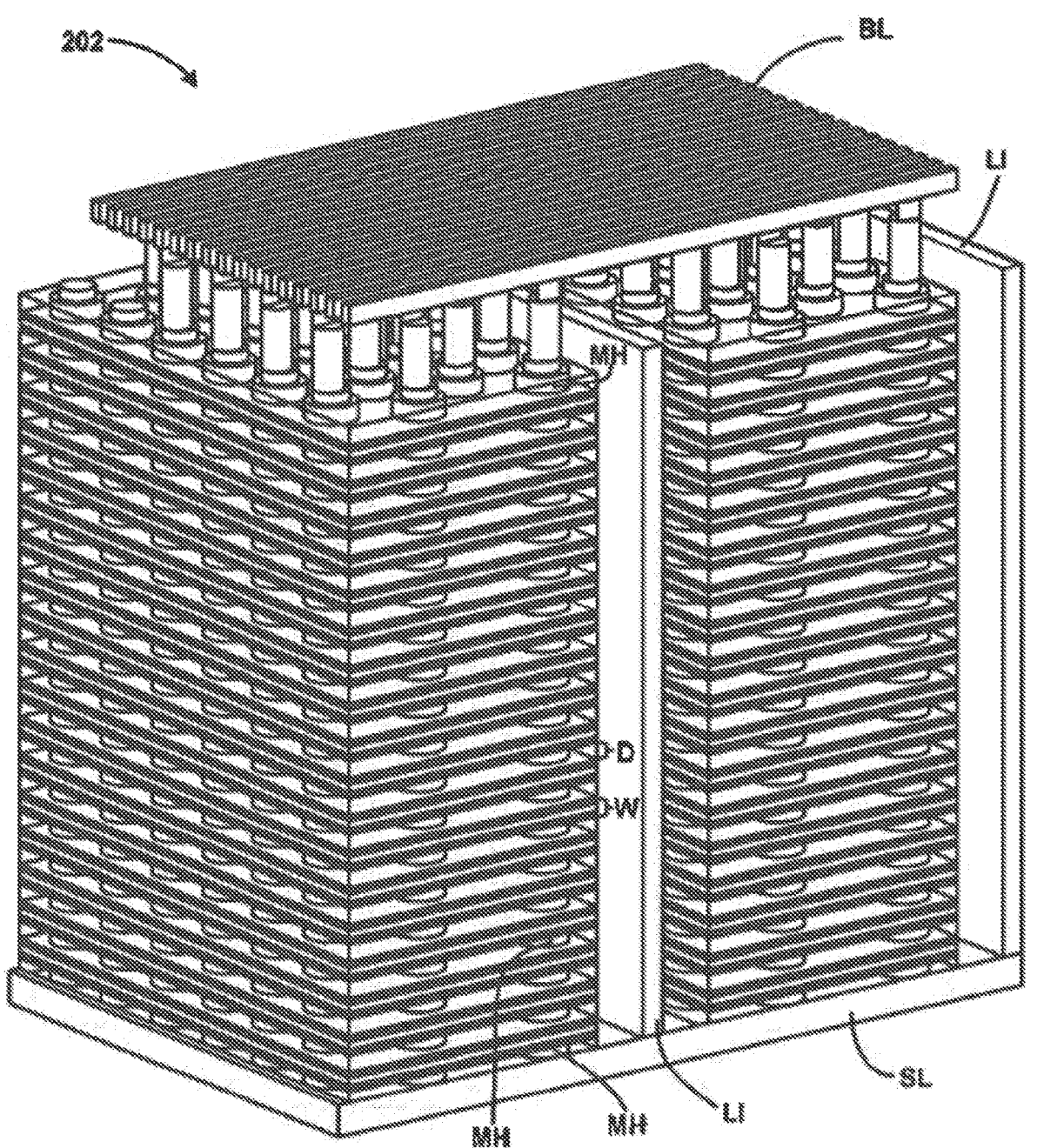
FIG. 3 is a perspective view of a portion of one embodiment of a three dimensional memory structure according to aspects of the disclosure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
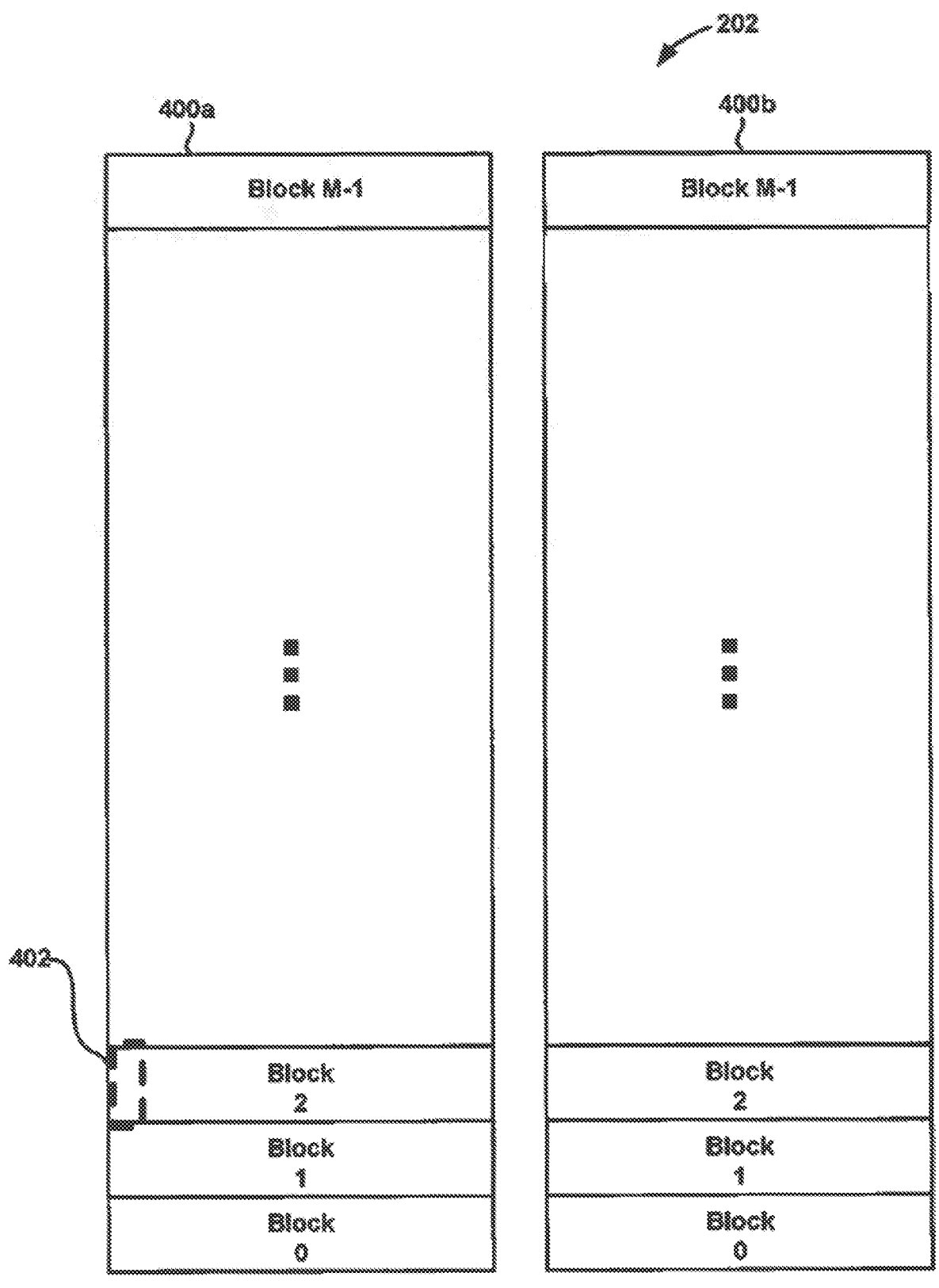
FIG. 4A is a block diagram of a memory structure having two planes according to aspects of the disclosure.

FIG. 4A is a block diagram explaining one example organization of memory structure 202, which is divided into two planes 400 a and 400 b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400 a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
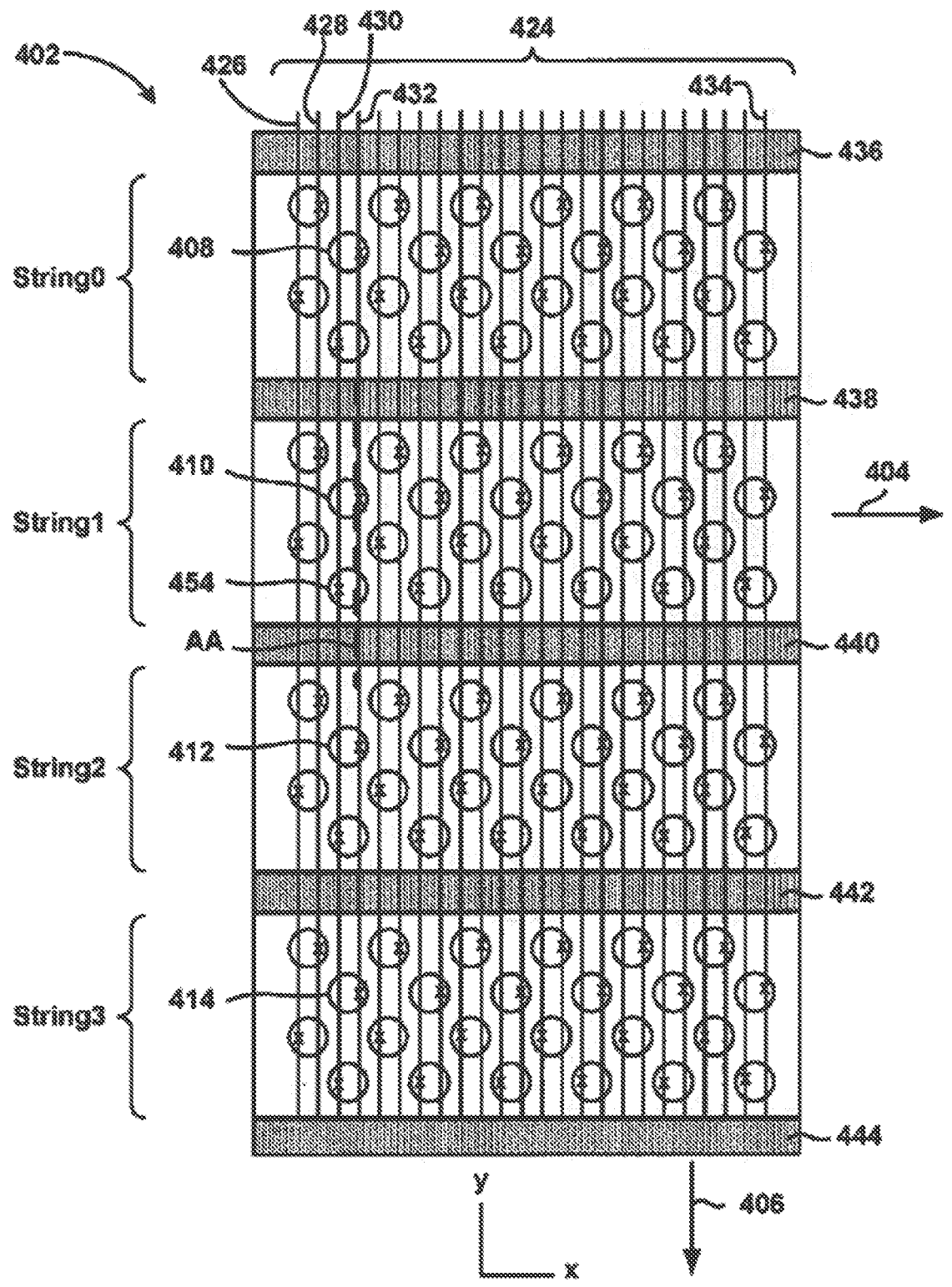
FIG. 4B depicts a top view of a portion of a block of memory cells according to aspects of the disclosure.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, String2 and String3. In the layers of the block that implement memory cells, String0, String1, String2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, Sting2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, Sting2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
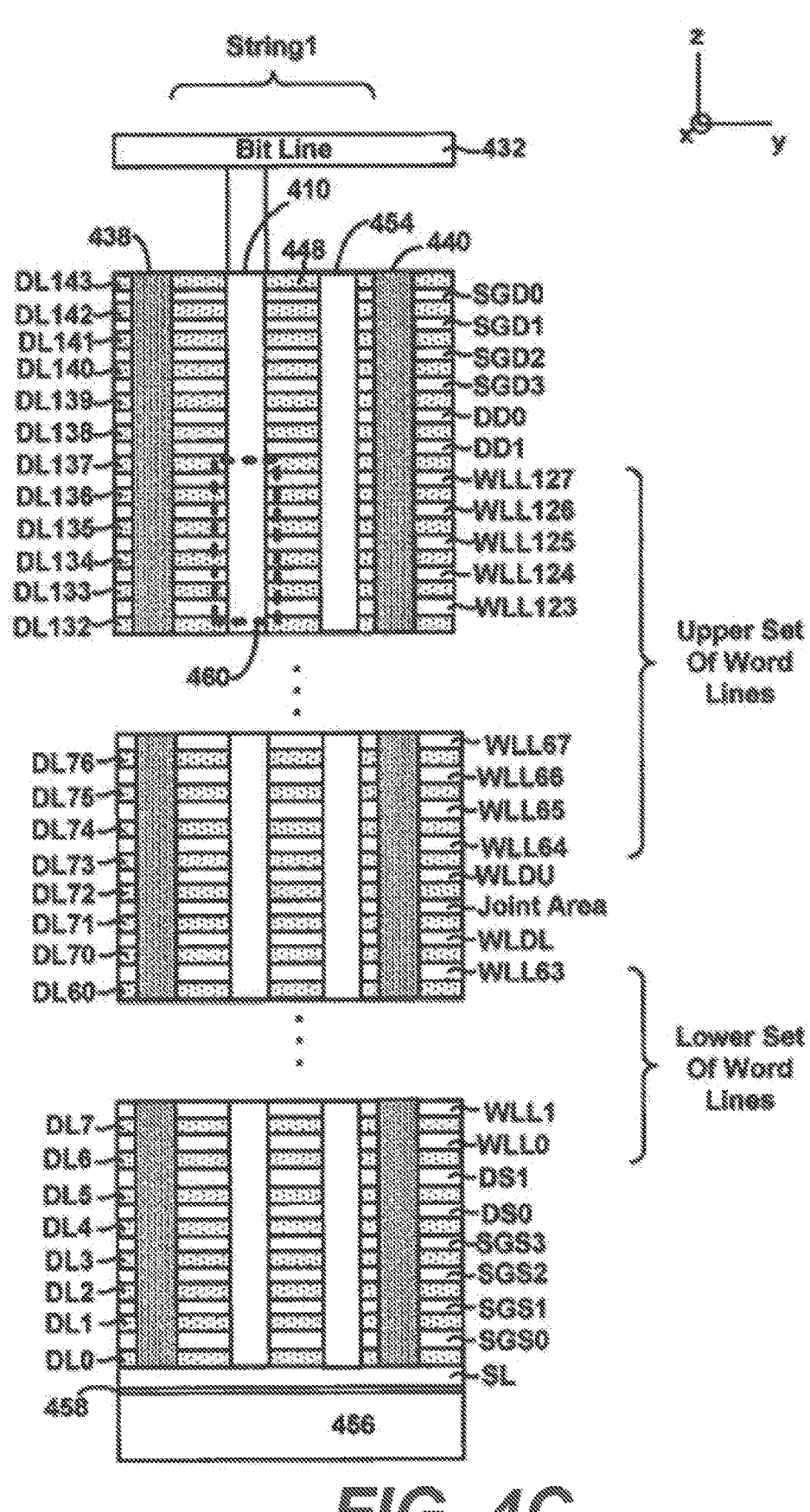
FIG. 4C depicts a cross sectional view of a portion of a block of memory cells according to aspects of the disclosure.

FIG. 4C depicts a portion of one embodiment of a three dimensional memory structure 202 showing a cross-sectional view along line AA of FIG. 4B. This cross sectional view cuts through memory holes 410 and 454 of String0 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twenty eight data word line layers WLL0-WLL127 for connecting to memory cells. Other embodiments can implement more or less than four drain side select layers, more or less than four source side select layers, more or less than six dummy word line layers, and more or less than one hundred and twenty eight word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL127 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL143. For example, dielectric layer DL136 is above word line layer WLL126 and below word line layer WLL127. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint Area, and laying down a second stack of sixty four word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
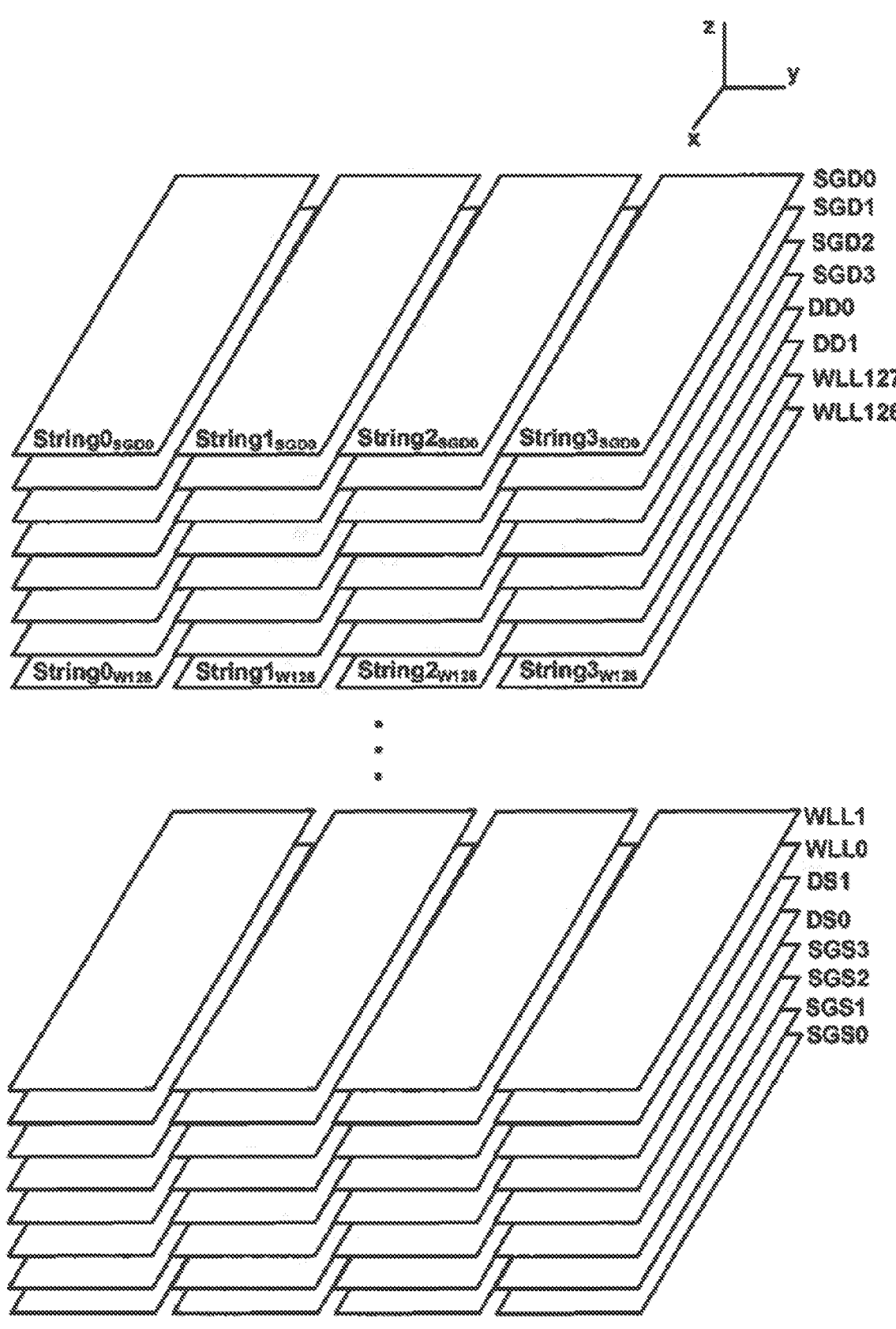
FIG. 4D depicts a view of the select gate layers and word line layers according to aspects of the disclosure.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL126 is divided into regions String0$_{W126}$, String1$_{W126}$, String2$_{W126}$ and String3$_{W126}$. In an embodiment, the four word line fingers on a same level are connected together. In another embodiment, each word line finger operates as a separate word line.

Likewise, drain side select gate layer SGD0 (the top layer) is divided into regions String0 SGD0, String1 SGD0, String2 SGD0 and String3 SGD0, also known as fingers or select line fingers. In an embodiment, the four select line fingers on a same level are connected together. In another embodiment, each select line finger operates as a separate word line.

Figure 4E:
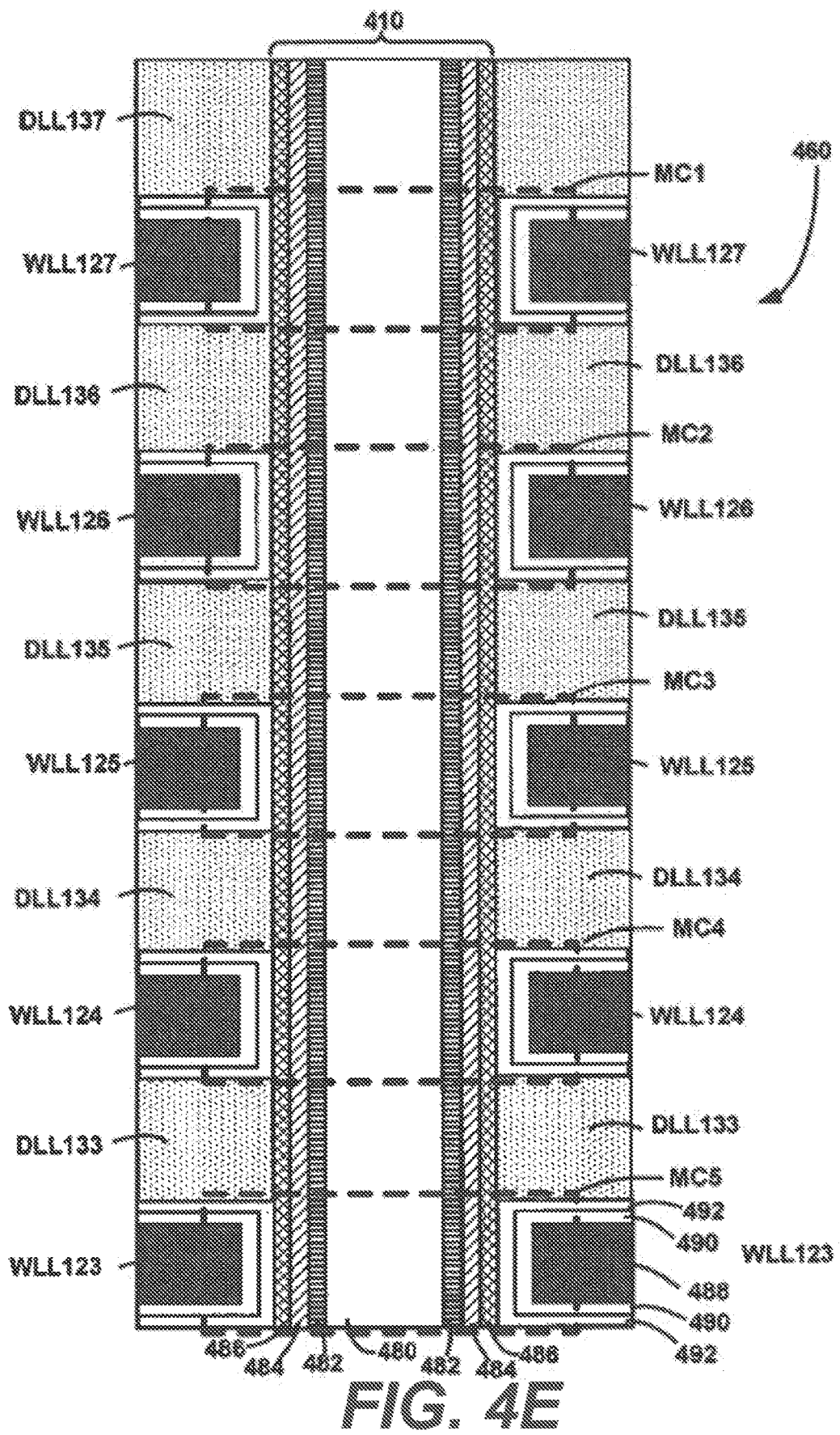
FIG. 4E is a cross sectional view of a memory hole of memory cells according to aspects of the disclosure.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL127 and a portion of memory hole 410 comprise a memory cell MC1. Word line layer WLL126 and a portion of memory hole 410 comprise a memory cell MC2. Word line layer WLL125 and a portion of memory hole 410 comprise a memory cell MC3. Word line layer WLL124 and a portion of memory hole 410 comprise a memory cell MC4. Word line layer WLL123 and a portion of memory hole 410 comprise a memory cell MC5.

In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
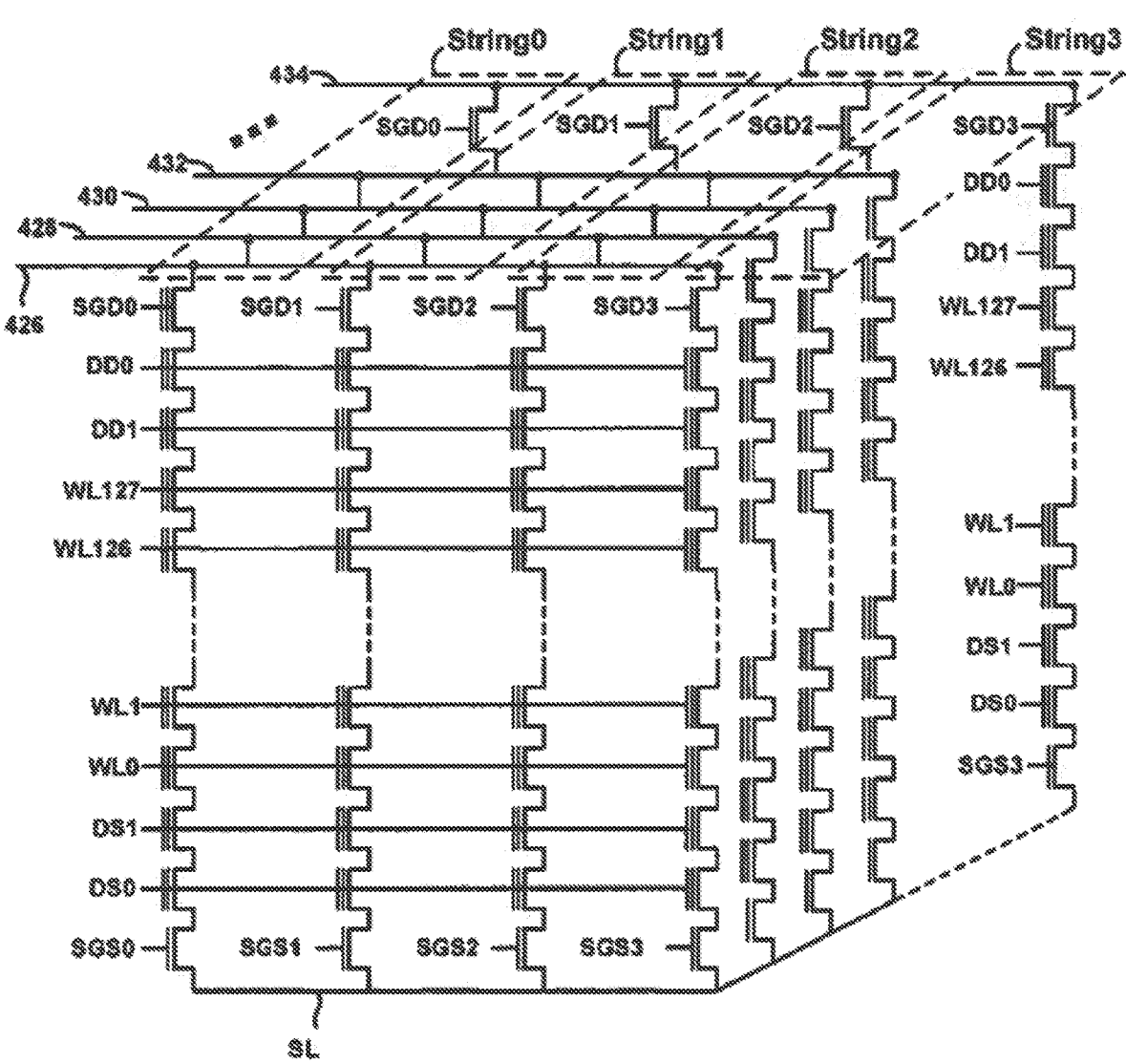
FIG. 4F is a schematic of a plurality of NAND strings according to aspects of the disclosure.

FIG. 4F is a schematic diagram of corresponding to portion 402 in Block 2 of FIGS. 4A-E, including bit lines 426, 428, 430, 432, . . . 434, and word lines WLL0-WLL127. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
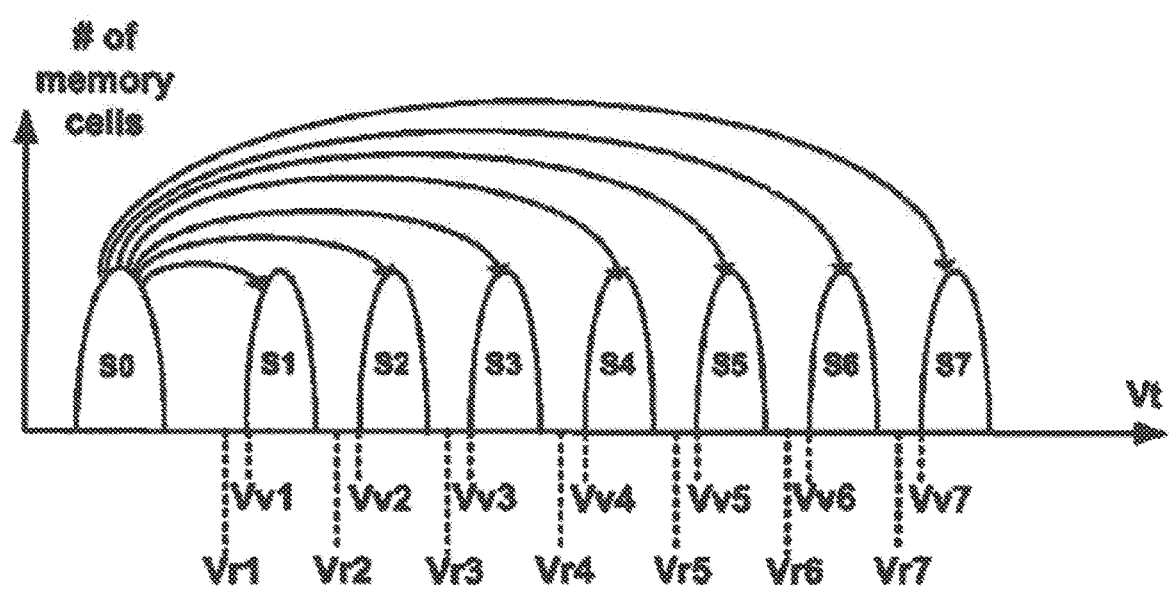
FIG. 5 depicts threshold voltage distributions according to aspects of the disclosure.
FIG. 6 is a table describing one example of an assignment of data values to data states according to aspects of the disclosure.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming.

The technology described herein also can be used with other types of programming in addition to full sequence programming (including, but not limited to, multiple stage/phase programming). In some embodiments, programmed states S1-S7 can overlap, with controller 104 (FIG. 1) relying on error correction to identify the correct data being stored.

FIG. 6 is a table describing an example assignment of data values to data states. In the table of FIG. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

Figures 7A, 7B, 7C, 7D, 7E:
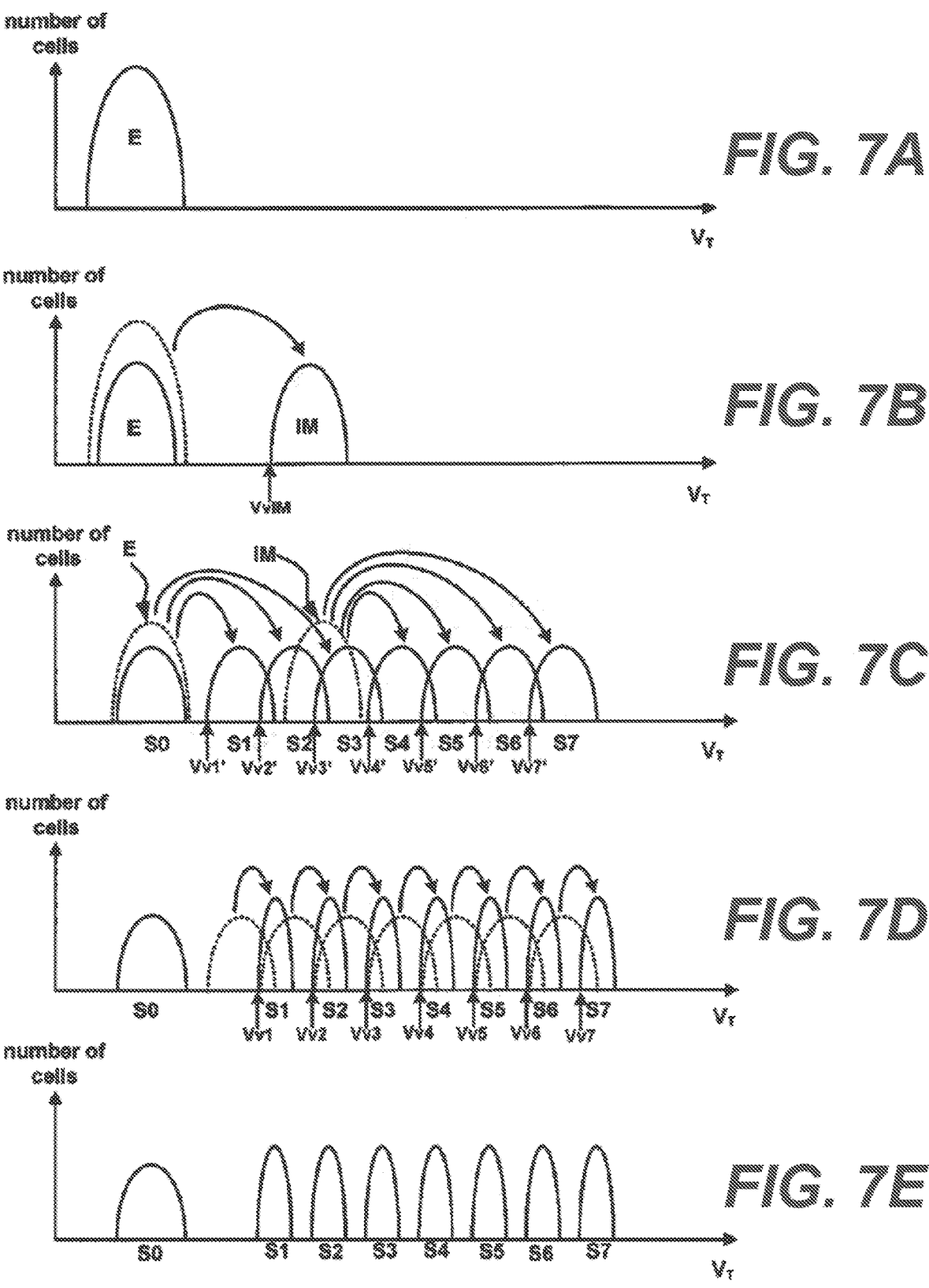
FIGS. 7A-7E depict various threshold voltage distributions and describe a process for programming non-volatile memory according to aspects of the disclosure.

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are data states S4, S5, S6 or S7 are programmed to an intermediate threshold voltage distribution IM. Those memory cells are targeted for data states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target data states. For example, those memory cells to be programmed to data state S7 are programmed from intermediate threshold voltage distribution IM to data state S7, those memory cells to be programmed to data state S6 are programmed from intermediate threshold voltage distribution IM to data state S6, those memory cells to be programmed to data state S5 are programmed from intermediate threshold voltage distribution IM to data state S5, and those memory cells to be in data state S4 are programmed from intermediate threshold voltage distribution IM to data state S4. This second programming phase is illustrated in FIG. 7C.

As can be seen in FIG. 7C, at the end of the second programming phase data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third programming phase, each of data states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than data states S1-S7. In an embodiment, the data states of FIGS. 7A-7E may be encoded according to the table of FIG. 6.

In some embodiments, those memory cells to be programmed to data state S4 are not programmed during the second phase and, therefore, remain in intermediate threshold voltage distribution IM. During the third programming phase, the memory cells are programmed from intermediate threshold voltage distribution IM to S4. In other embodiments, memory cells destined for other states can also remain in intermediate threshold voltage distribution IM or erase threshold voltage distribution E during the second phase.

Figure 8:
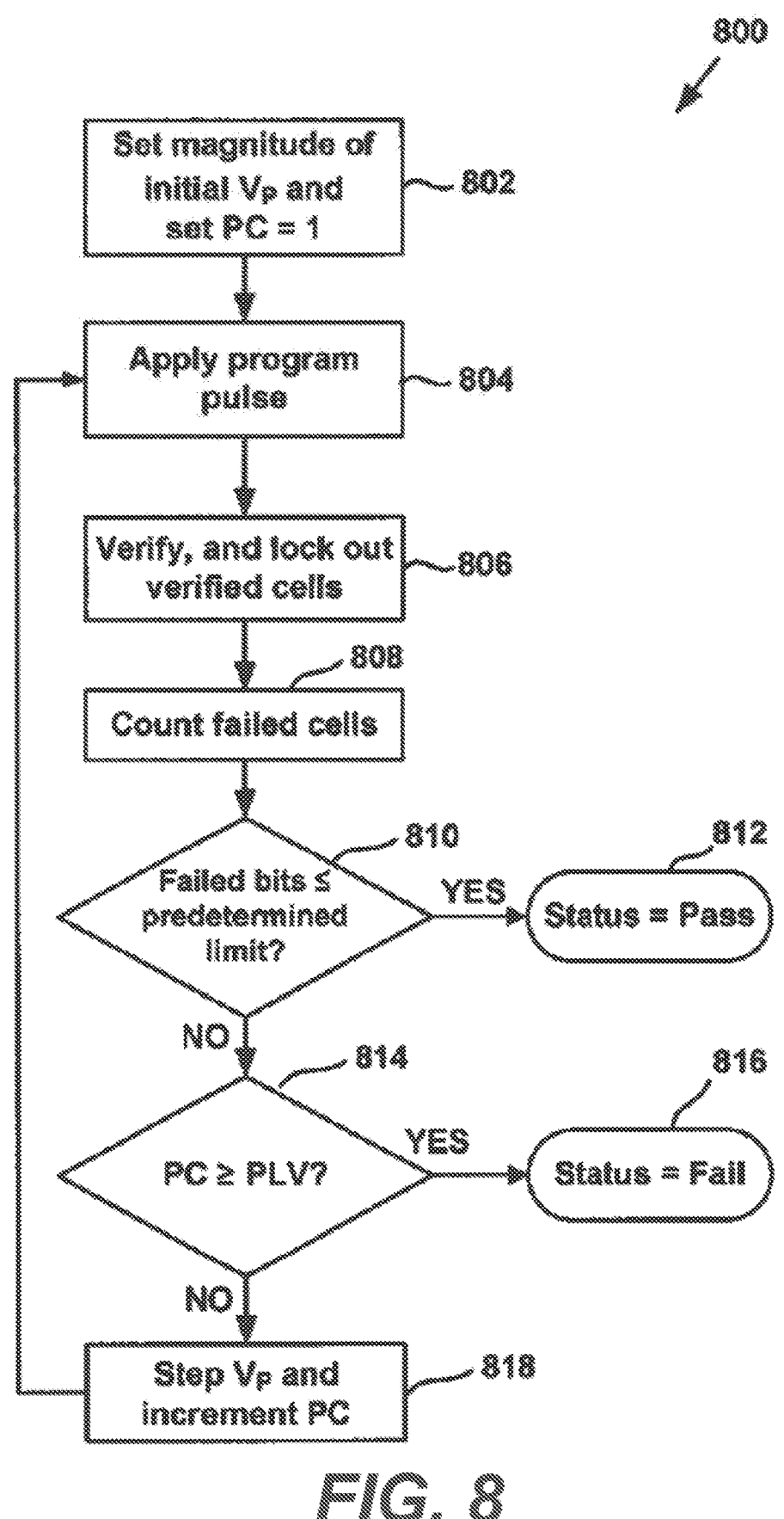
FIG. 8 is a flowchart describing an embodiment of a process for programming non-volatile memory according to aspects of the disclosure.

FIG. 8 is a flowchart describing an embodiment of a process 800 for programming a memory cell. In an example embodiment, process 800 is performed on memory die 106 (FIG. 1) using the control circuits discussed above. For example, process 800 can be performed at the direction of state machine 216 (FIG. 2). Process 800 also can be used to implement the full sequence programming discussed above. Additionally, process 800 can be used to implement each phase of a multi-phase programming process.

Typically, a program voltage is applied to the control gates (via a selected word line) during a program operation as a series of program pulses. Between programming pulses are a set of verify pulses to perform verification. In many implementations, the magnitude of the program pulses increase with each successive program pulse by a predetermined program step size. In step 802 of process 800, a programming voltage ($V_P$) is initialized to a starting program voltage $V_{Pinit}$ (e.g., between about 12V to about 16V, or some other value) and a program counter PC maintained by state machine 216 is initialized at 1.

In step 804, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 804, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 806, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 808, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells.

In an embodiment, one total count reflects the total number of memory cells currently being programmed that have failed the last verify step. In another embodiment, separate counts are kept for each data state.

In step 810, a determination is made whether the count from step 808 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 812. In this situation, enough memory cells programmed correctly such that the few remaining memory cells that have not been completely programmed can be corrected using ECC during the read process.

In some embodiments, the predetermined limit used in step 810 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 814 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 816.

If the program counter PC is not greater than or equal to program limit value PLV, then the process continues at step 820 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value). The process loops back to step 804 and another program pulse is applied to the selected word line so that another iteration (steps 804-818) of programming process 800 is performed. Each pass through steps 804-818 is referred to herein as a "program loop."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 804 a program pulse is applied to the selected word line, and at step 806 memory cells coupled to the selected word line are verified using an appropriate set of verify reference voltages to perform one or more verify operations. Steps 804 and 806 are part of an iterative loop in which program pulses are applied as a series of program pulses that step up in magnitude, with intervening verify reference pulses between consecutive program pulses. Such an iterative loop is referred to herein as a "program-verify iteration."

FIG. 9 illustrates an example of such program-verify pulses applied to a selected word line. In particular, FIG. 9 depicts program pulses 900, 902 and 904 applied to the selected word line during three successive iterations of step 804 of FIG. 8. Between program pulses 900, 902 and 904 verify pulses are applied to the selected word line during three successive program-verify iterations of steps 804-806 of FIG. 8 to determine whether threshold voltages of the memory cells are greater than the respective verify reference voltages.

FIG. 9 shows a verify pulse for each of the programmed states S1-S7 between each of program pulses 900, 902 and 904. These verify pulses consume a significant portion of a program operation. As the number of programmed states stored per memory cell increases, this situation becomes worse, limiting programming speed. FIG. 9 corresponds to memory cells that store 3-bits per cell and require 7 verify levels. In a 4-bit per cell embodiment, a verify of all non-erased states would need 15 verify operations between program pulses.

Figure 10A:
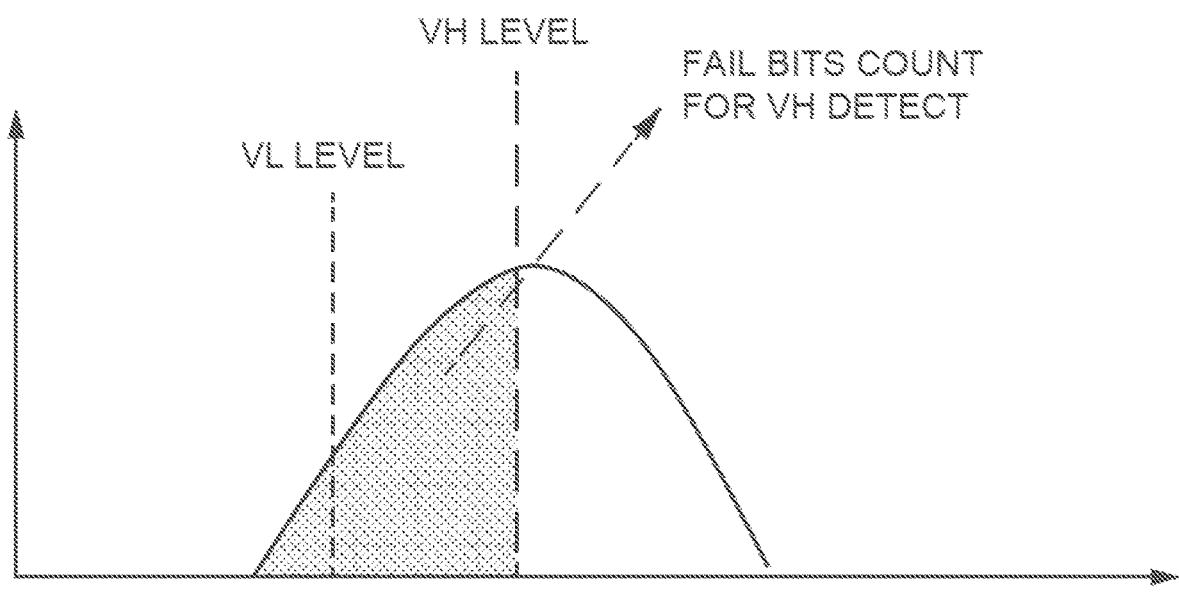
FIGS. 10A and 10B show plots of a threshold voltage of memory cells along with a fail bits count using a verify high program verify voltage and a verify low program verify voltage during a verify loop or iteration of a program-verify operation according to aspects of the disclosure.
Figure 10B:
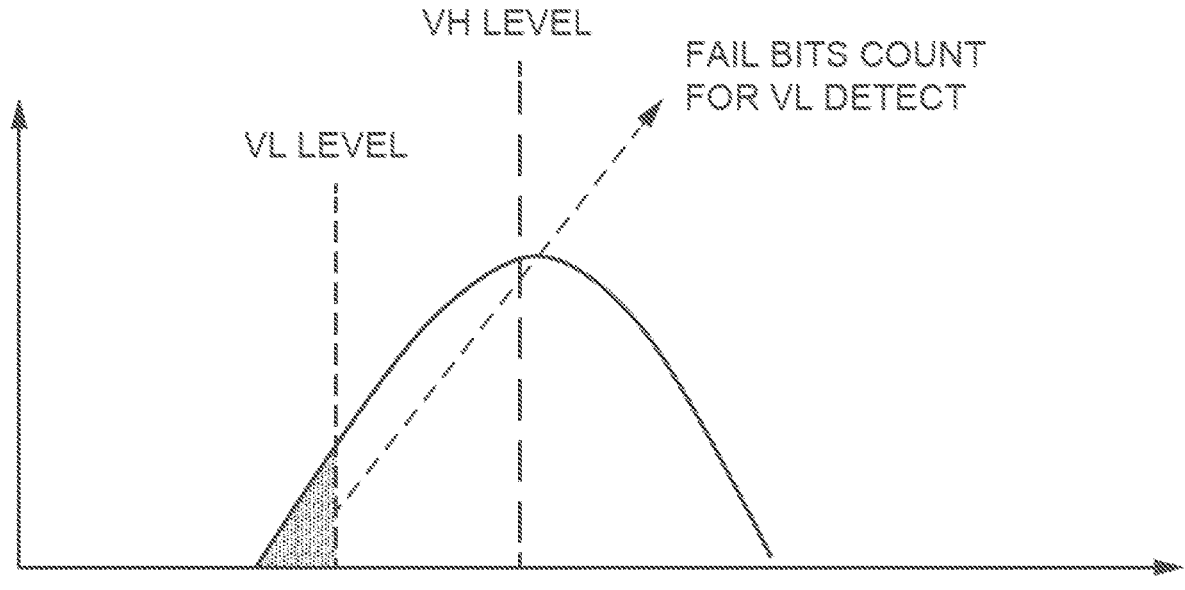
Figure 11:
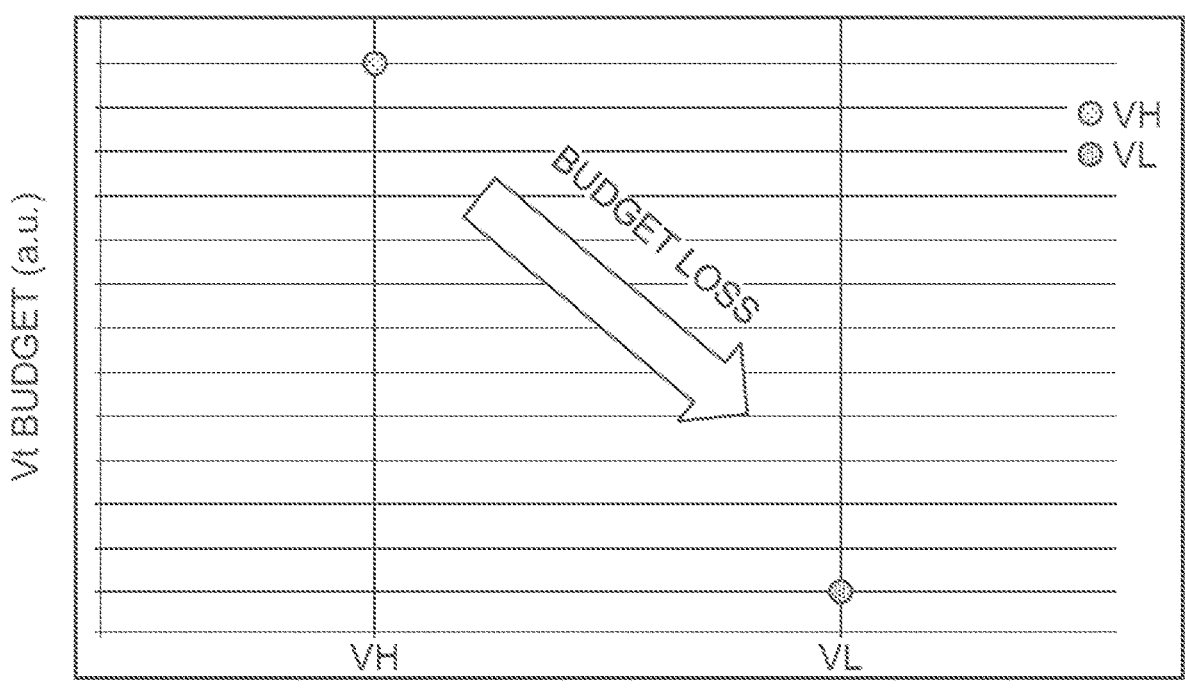
FIG. 11 is a plot of threshold voltage budget of memory cells verified using the verify high program verify voltage and the verify low program verify voltage according to aspects of the disclosure.
Figure 12:
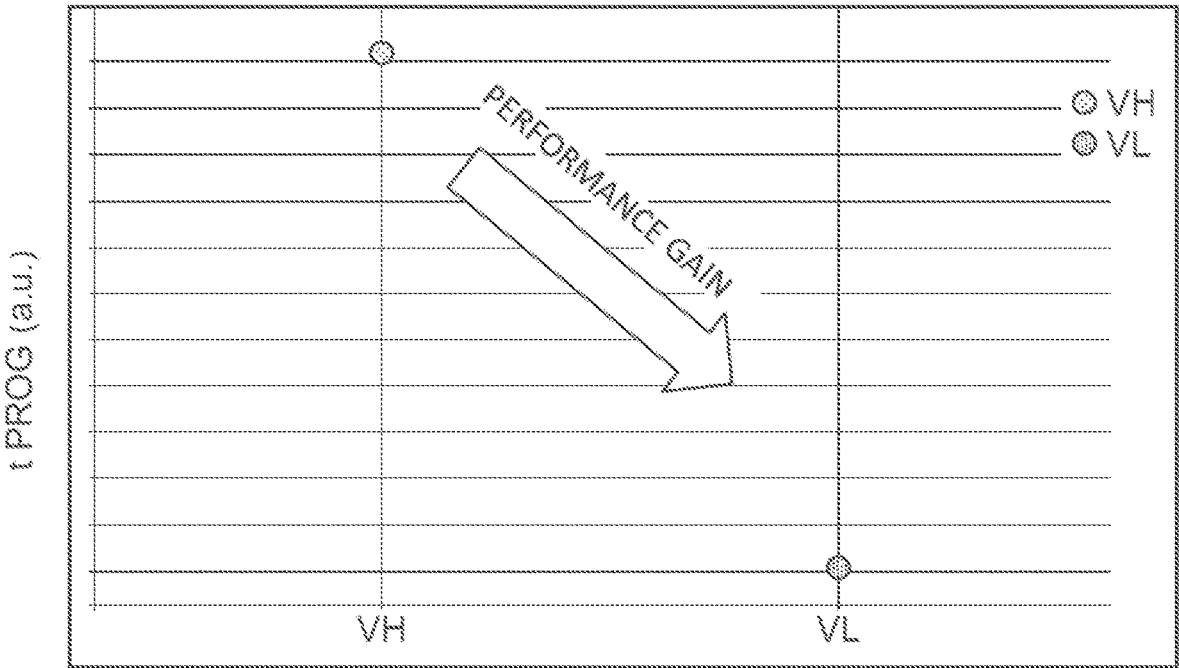
FIG. 12 is a plot of program time of memory cells verified using the verify high program verify voltage and the verify low program verify voltage according to aspects of the disclosure.
Figure 13:
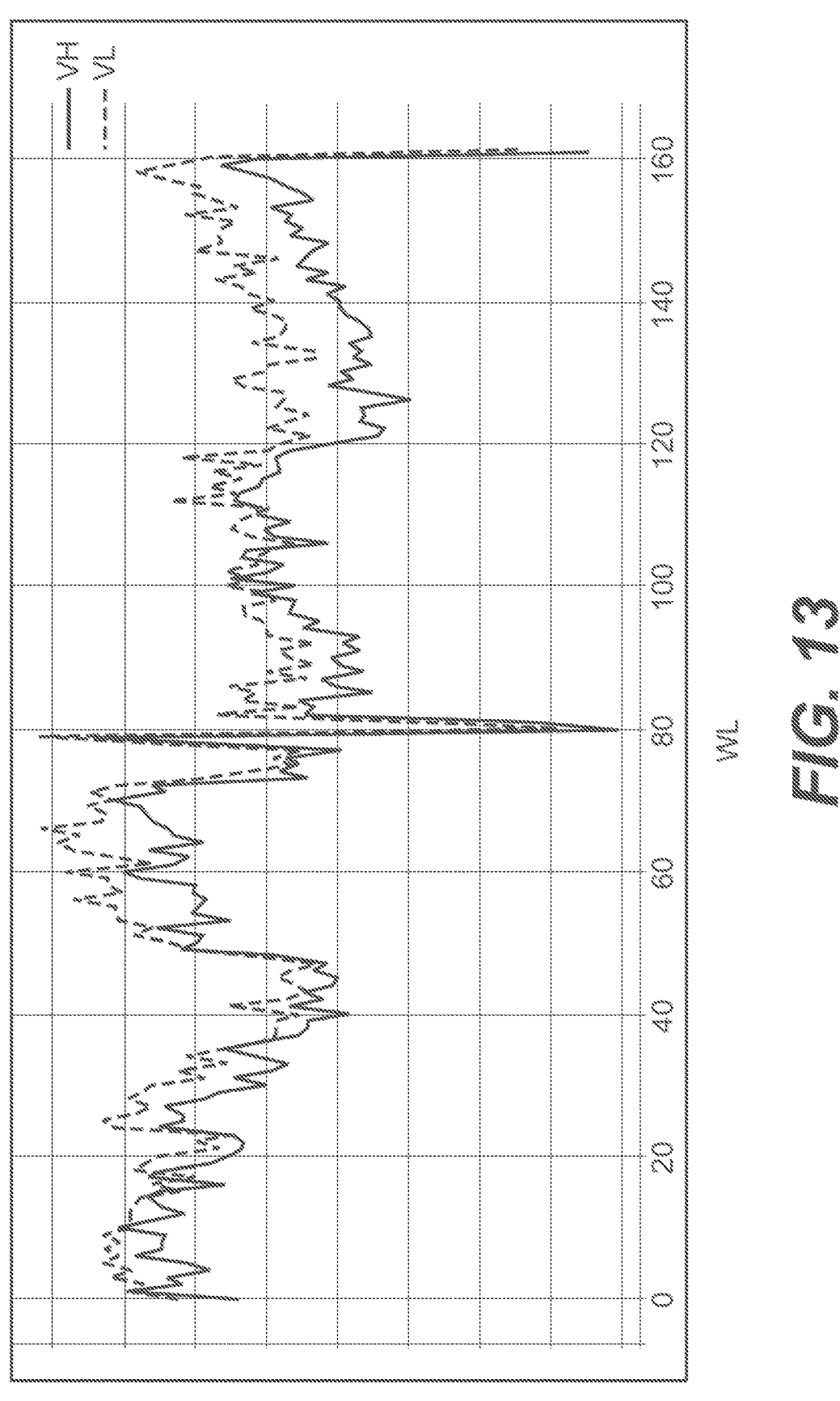
FIG. 13 is a plot of average state widths of a plurality of data states of memory cells verified using the verify high program verify voltage and the verify low program verify voltage for each word line of an example memory apparatus.
Figure 14:
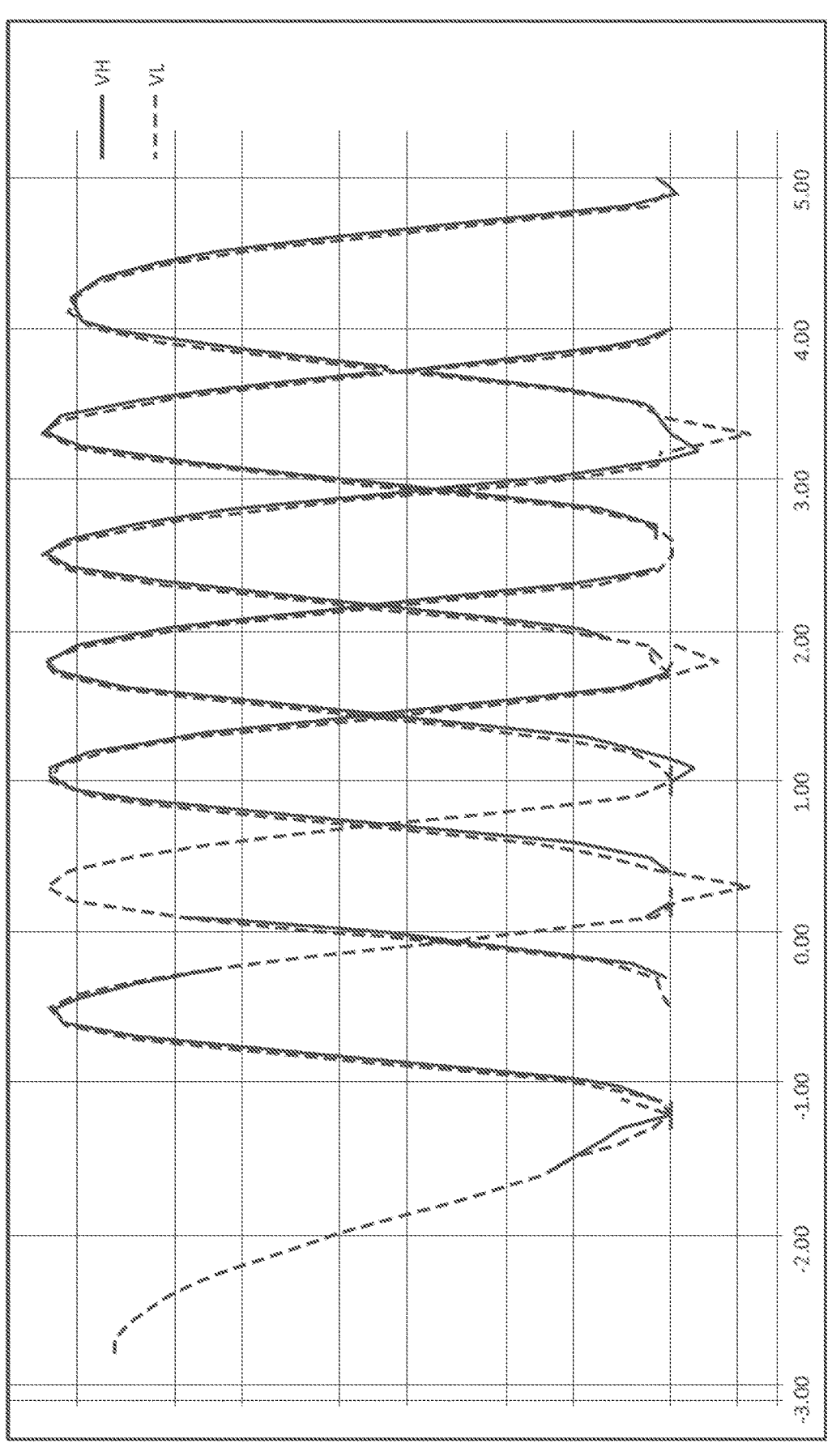
FIG. 14 is a plot of the threshold voltage of memory cells verified using the verify high program verify voltage and the verify low program verify voltage and illustrates the plurality of data states of the memory cells according to aspects of the disclosure.

During a program-verify operation, two ways to determine the termination of the verify may be utilized. The first way is to use the verify high program verify voltage VH, in which once the fail bits count is smaller than the threshold, the corresponding verify will be terminated in the next verify loop. The second way is to use the verify low program verify voltage VL. As mentioned above, tradeoffs exist between threshold voltage budget and programming performance when using the verify low program verify voltage VL or the verify high program verify voltage VH for the verify or program-verify operation. FIGS. 10A and 10B show plots of a threshold voltage of memory cells along with a fail bits count using a verify high program verify voltage VH and a verify low program verify voltage VL during a verify loop or iteration of a program-verify operation. FIG. 11 is a plot of threshold voltage budget of memory cells verified using the verify high program verify voltage VH and the verify low program verify voltage VL. FIG. 12 is a plot of program time tPROG of memory cells verified using the verify high program verify voltage VH and the verify low program verify voltage VL. FIG. 13 is a plot of average state widths of a plurality of data states of memory cells verified using the verify high program verify voltage VH and the verify low program verify voltage VL for each word line of an example memory apparatus. FIG. 14 is a plot of the threshold voltage of memory cells verified using the verify high program verify voltage VH and the verify low program verify voltage VL and illustrates the plurality of data states of the memory cells. It has been observed that by using the VL level or the verify low program verify voltage VL, there is a significant program performance gain (FIG. 12), while there is also a threshold voltage budget degradation (FIG. 11), which is due to state width widening (FIGS. 13 and 14).

FIG. 15 shows plots of the threshold voltage of memory cells along with the fail bits count using a verify high program verify voltage VH during two sequential loops or iterations of the program-verify operation. As shown, as the detected value or count of the memory cells less than the verify high program verify voltage VH is larger than the fail bit count criteria, the verify will proceed in next verify loop. However, during loop n program (i.e., the program pulse immediately before the loop n verify), all the bits or memory cells have already passed the target level (verify high program verify voltage VH), making loop n verify unnecessary. FIG. 16 shows plots of the threshold voltage of memory cells along with a fail bits count using a verify low program verify voltage VL during two sequential loops or iterations of the program-verify operation. As shown, as the detected value or count of the memory cells less than the verify low program verify voltage VL is smaller than the fail bit count criteria, the verify will be terminated in next verify loop or iteration. By using verify low program verify voltage VL, the verify numbers can be reduced, thus improving the performance, however, it is possible that with passing the verify low program verify voltage VL, there are still a lot of memory cells not passing verify high program verify voltage VH, leading to state width widening. So, when detecting using the verify high program verify voltage VH (VH detect), the data states will undergo unnecessary verify iterations, thus losing performance. When detecting using the verify low program verify voltage VL (VL detect), data states may skip necessary verify iterations, thus losing threshold voltage budget. Accordingly, the dilemma is mainly caused by the flexibility of the fail bits count criteria.

Figure 17:
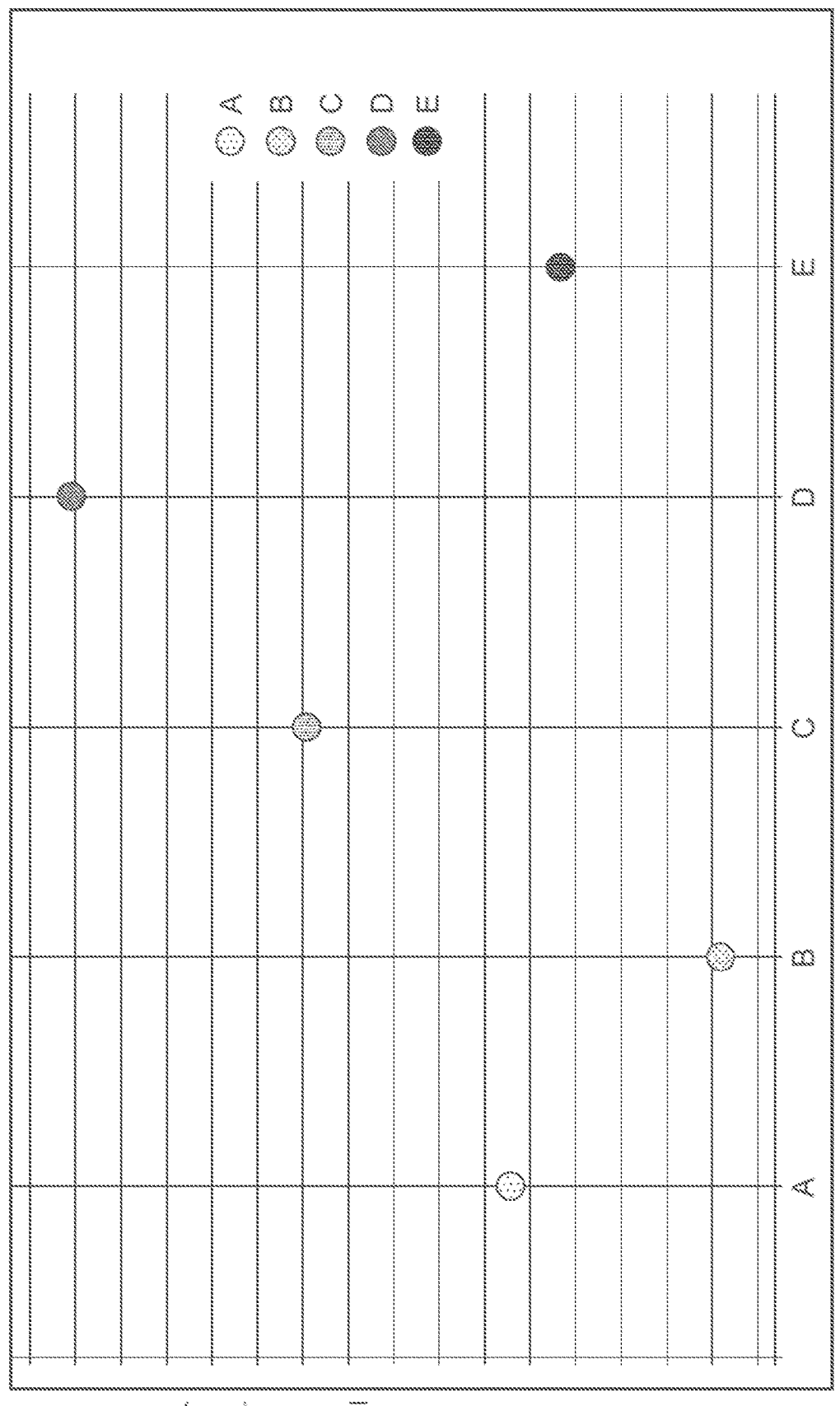
FIG. 17 shows a plot of a difference in data state width using the verify low program verify voltage compared to the verify low program verify voltage for each of a plurality of data states.
Figure 18:
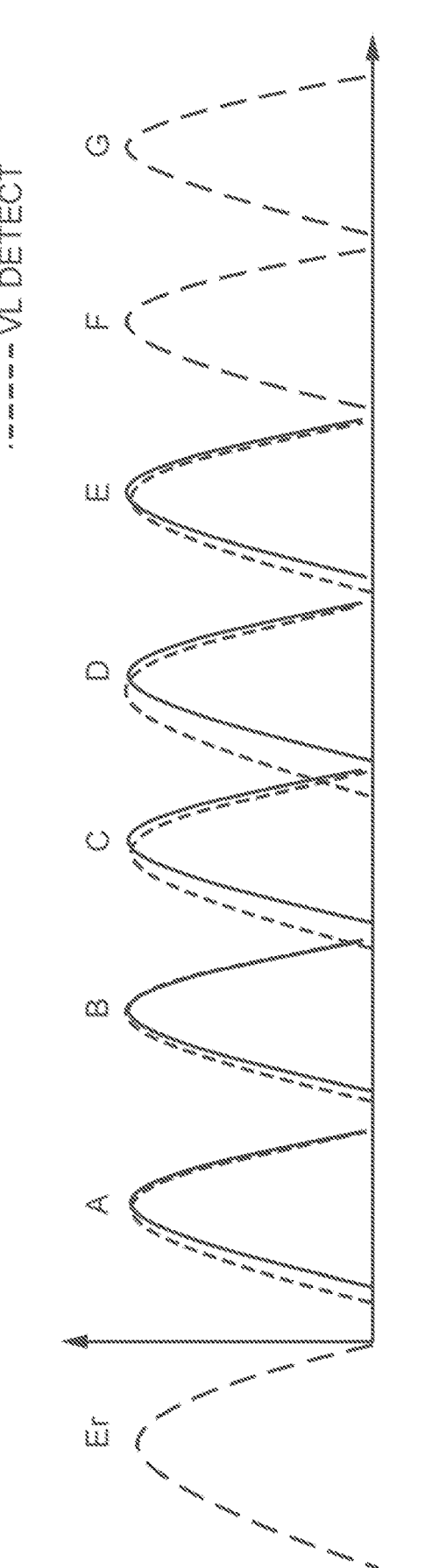
FIG. 18 is a plot of distributions of the threshold voltage of example memory cells illustrating a plurality of data states verified using the verify low program verify voltage compared to the verify low program verify voltage according to aspects of the disclosure.

FIG. 17 shows a plot of a difference in data state width (i.e., how wide the data states measured in threshold voltage) using the verify low program verify voltage VL compared to the verify low program verify voltage VL for each of a plurality of data states. FIG. 18 is a plot of distributions of the threshold voltage of example memory cells illustrating a plurality of data states verified using the verify low program verify voltage VL compared to the verify low program verify voltage VL. As shown, the VL detect will degrade state width. Therefore, for each state, by using VH or VL detect, there is a threshold voltage distribution width difference. This difference can reflect how sensitivity of each state to the change of detection methods (using the verify low program verify voltage VL or the verify low program verify voltage VL). In addition, different data states have different sensitivity to the change of detection level (VH or VL detect).

Consequently, described herein is a memory apparatus (e.g., storage system 100 of FIG. 1, memory die 200 of FIG. 2) including memory cells (e.g., memory cells MC1-MC5 of FIG. 4E) each connected to one of a plurality of word lines (e.g., word line layers WLL0-WLL127 of FIG. 4C). The memory cells are configured to retain a threshold voltage corresponding to one of a plurality of data states (e.g., data states S0-S7 of FIG. 5). The memory apparatus also includes a control circuit or means (e.g., one or any combination of control circuitry 204, decoders 208, 210, sense blocks SB1, SB2, . . . , SBp, read/write circuits 206 of FIG. 2, and so forth) coupled to the plurality of word lines and the memory holes. The control means is configured to apply verification pulses of a plurality of program verify voltages each associated with one of the plurality of data states to selected ones of the plurality of word lines and count the memory cells having the threshold voltage below each of the plurality of program verify voltages targeted for each of the memory cells being programmed during each of a plurality of verify loops of a program-verify operation. The control means is also configured to terminate the plurality of verify loops for the memory cells targeted for one of the plurality of data states in response to the count of the memory cells targeted for the one of the plurality of data states being greater than or equal to a predetermined count threshold, the predetermined count threshold being different for at least one of the plurality of data states compared to the predetermined count threshold for other ones of the plurality of data states. According to an aspect, the predetermined count threshold is individually adjustable for each of the plurality of data states. Referring back to FIG. 9, for example, and as discussed above, the control means is further configured to apply one of a plurality of pulses of a program voltage to the selected ones of the plurality of word lines prior to applying the verification pulses of the plurality of program verify voltages each associated with one of the plurality of data states to the selected ones of the plurality of word lines during the program-verify operation.

Again, the plurality of program verify voltages each associated with one of the plurality of data states includes both a verify low program verify voltage and a verify high program verify voltage associated with each of the plurality of data states. Thus, the control means may be further configured to count the memory cells having the threshold voltage below the verify low program verify voltage associated with the each of the plurality of data states targeted for each of the memory cells being programmed during each of the plurality of verify loops of the program-verify operation. According to another aspect, the verify high program verify voltage is greater in magnitude than the verify low program verify voltage. So, instead of all of the plurality of data states sharing the same fail bit count criteria or predetermined count threshold, the fail bits count criteria for each of the plurality of data states may be split, so that each of the plurality of data states can be fine-tuned to narrow the state width when switch from VH detect to VL detect. Accordingly, the predetermined count threshold for at least one of the plurality of data states is selected to compensate for different sensitivities of the memory cells targeted for at least one of the plurality of data states being verified during each of the plurality of verify loops of the program-verify operation using the verify low program verify voltage and the verify high program verify voltage compared to the memory cells targeted for other ones of the plurality of data states being verified during each of the plurality of verify loops of the program-verify operation using the verify low program verify voltage and the verify high program verify voltage.

Referring back to FIG. 5 and FIGS. 7C-7E, for example, each of the memory cells is configured to store three bits and the plurality of data states includes, in order of the threshold voltage increasing, in magnitude, an erase state S0 (i.e., Er state) and a first data state S1 and a second data state S2 and a third data state S3 and fourth data state S4 and a fifth data state S5 and a sixth data state S6 and a seventh data state S7. FIG. 19 is a plot of threshold voltage distributions for memory cells each configured to store three bits for a plurality of data states along with the predetermined count threshold for various ones of the plurality of data states and an example verify iteration. As shown, the predetermined count threshold for the first data state S1 (i.e., A data state) is a first predetermined count threshold Criteria_A and the predetermined count threshold for the second data state S2 (i.e., B data state) is a second predetermined count threshold Criteria_B and the predetermined count threshold for the third data state S3 (i.e., C data state) is a third predetermined count threshold Criteria_C and the predetermined count threshold for the fourth data state S4 (i.e., D data state) is a fourth predetermined count threshold Criteria_D and the predetermined count threshold for the fifth data state S5 (i.e., E data state) is a fifth predetermined count threshold Criteria_E and the predetermined count threshold for the sixth data state S6 (i.e., F data state) is a sixth predetermined count threshold (not shown) and the predetermined count threshold for the seventh data state S7 (i.e., G data state) is a seventh predetermined count threshold (not shown). While eight data states are discussed, it should be understood that the techniques described may be used for memory cells storing any number of bits (e.g., quad-level cells (QLC) storing four bits per memory cell, five-level cells (PLC) storing five bits per memory cell, etc.) The benefit realized using the verify low program verify voltage and the predetermined count threshold being individually adjustable for each of the plurality of data states, there will be ~6-7% performance gain without any threshold voltage budget loss.

FIG. 20 illustrates steps of a method of operating a memory apparatus. As discussed above, the memory apparatus (e.g., storage system 100 of FIG. 1, memory die 200 of FIG. 2) includes memory cells (e.g., memory cells MC1-MC5 of FIG. 4E) each connected to one of a plurality of word lines (e.g., word line layers WLL0-WLL127 of FIG. 4C). The memory cells are configured to retain a threshold voltage corresponding to one of a plurality of data states (e.g., data states S0-S7 of FIG. 5). The method includes the step of 2000 applying verification pulses of a plurality of program verify voltages each associated with one of the plurality of data states to selected ones of the plurality of word lines and counting the memory cells having the threshold voltage below each of the plurality of program verify voltages targeted for each of the memory cells being programmed during each of a plurality of verify loops of a program-verify operation. The method also includes the step of 2002 terminating the plurality of verify loops for the memory cells targeted for one of the plurality of data states in response to the count of the memory cells targeted for the one of the plurality of data states being greater than or equal to a predetermined count threshold, the predetermined count threshold being different for at least one of the plurality of data states compared to the predetermined count threshold for other ones of the plurality of data states. Again, according to an aspect, the predetermined count threshold is individually adjustable for each of the plurality of data states. As above, referring back to FIG. 9, for example, the method also includes applying one of a plurality of pulses of a program voltage to the selected ones of the plurality of word lines prior to applying the verification pulses of the plurality of program verify voltages each associated with one of the plurality of data states to the selected ones of the plurality of word lines during the program-verify operation.

Once again, the plurality of program verify voltages each associated with one of the plurality of data states includes both the verify low program verify voltage and the verify high program verify voltage associated with each of the plurality of data states. So, the method further includes the step of counting the memory cells having the threshold voltage below the verify low program verify voltage associated with the each of the plurality of data states targeted for each of the memory cells being programmed during each of the plurality of verify loops of the program-verify operation. As above, the verify high program verify voltage is greater in magnitude than the verify low program verify voltage. Again, the predetermined count threshold for at least one of the plurality of data states is selected to compensate for different sensitivities of the memory cells targeted for at least one of the plurality of data states being verified during each of the plurality of verify loops of the program-verify operation using the verify low program verify voltage and the verify high program verify voltage compared to the memory cells targeted for other ones of the plurality of data states being verified during each of the plurality of verify loops of the program-verify operation using the verify low program verify voltage and the verify high program verify voltage.

Again, referring back to FIG. 5, FIGS. 7C-7E and FIG. 19, for example, each of the memory cells is configured to store three bits and the plurality of data states includes, in order of the threshold voltage increasing, in magnitude, an erase state S0 (Er state in FIG. 19) and a first data state S1 (A data state in FIG. 19) and a second data state S2 (B data state in FIG. 19) and a third data state S3 (C data state in FIG. 19) and fourth data state S4 (D data state in FIG. 19) and a fifth data state S5 (E data state in FIG. 19) and a sixth data state S6 (F data state in FIG. 19) and a seventh data state S7 (G data state in FIG. 19). Thus, referring back to FIG. 19 specifically, the predetermined count threshold for the first data state S1 (i.e., A data state) is a first predetermined count threshold Criteria_A and the predetermined count threshold for the second data state S2 (i.e., B data state) is a second predetermined count threshold Criteria_B and the predetermined count threshold for the third data state S3 (i.e., C data state) is a third predetermined count threshold Criteria_C and the predetermined count threshold for the fourth data state S4 (i.e., D data state) is a fourth predetermined count threshold Criteria_D and the predetermined count threshold for the fifth data state S5 (i.e., E data state) is a fifth predetermined count threshold Criteria_E and the predetermined count threshold for the sixth data state S6 (i.e., F data state) is a sixth predetermined count threshold (not shown) and the predetermined count threshold for the seventh data state S7 (i.e., G data state) is a seventh predetermined count threshold (not shown).

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A memory apparatus, comprising:

memory cells each connected to one of a plurality of word lines and configured to retain a threshold voltage corresponding to one of a plurality of data states; and a control means coupled to the plurality of word lines and configured to:

apply verification pulses of a plurality of program verify voltages each associated with one of the plurality of data states to selected ones of the plurality of word lines and count the memory cells having the threshold voltage below each of the plurality of program verify voltages targeted for each of the memory cells being programmed during each of a plurality of verify loops of a program-verify operation, and terminate the plurality of verify loops for the memory cells targeted for one of the plurality of data states in response to the count of the memory cells targeted for the one of the plurality of data states being greater than or equal to a predetermined count threshold, the predetermined count threshold being different for at least one of the plurality of data states compared to the predetermined count threshold for other ones of the plurality of data states, and the predetermined count threshold being individually adjustable for at least five data states of the plurality of data states.

2. The memory apparatus as set forth in claim 1, wherein the predetermined count threshold is individually adjustable for each of the plurality of data states.

3. The memory apparatus as set forth in claim 1, wherein the plurality of program verify voltages each associated with one of the plurality of data states includes both a verify low program verify voltage and a verify high program verify voltage associated with each of the plurality of data states, and the control means is further configured to count the memory cells having the threshold voltage below the verify low program verify voltage associated with the each of the plurality of data states targeted for each of the memory cells being programmed during each of the plurality of verify loops of the program-verify operation.

4. The memory apparatus as set forth in claim 3, wherein the verify high program verify voltage is greater in magnitude than the verify low program verify voltage.

5. The memory apparatus as set forth in claim 3, wherein the predetermined count threshold for at least one of the plurality of data states is selected to compensate for different sensitivities of the memory cells targeted for at least one of the plurality of data states being verified during each of the plurality of verify loops of the program-verify operation using the verify low program verify voltage and the verify high program verify voltage compared to the memory cells targeted for other ones of the plurality of data states being verified during each of the plurality of verify loops of the program-verify operation using the verify low program verify voltage and the verify high program verify voltage.

6. The memory apparatus as set forth in claim 1, wherein the control means is further configured to apply one of a plurality of pulses of a program voltage to the selected ones of the plurality of word lines prior to applying the verification pulses of the plurality of program verify voltages each associated with one of the plurality of data states to the selected ones of the plurality of word lines during the program-verify operation.

7. The memory apparatus as set forth in claim 1, wherein the each of the memory cells is configured to store three bits and the plurality of data states includes, in order of the threshold voltage increasing, in magnitude, an erase state and a first data state and a second data state and a third data state and fourth data state and a fifth data state and a sixth data state and a seventh data state, the predetermined count threshold for the first data state is a first predetermined count threshold and the predetermined count threshold for the second data state is a second predetermined count threshold and the predetermined count threshold for the third data state is a third predetermined count threshold and the predetermined count threshold for the fourth data state is a fourth predetermined count threshold and the predetermined count threshold for the fifth data state is a fifth predetermined count threshold and the predetermined count threshold for the sixth data state is a sixth predetermined count threshold and the predetermined count threshold for the seventh data state is a seventh predetermined count threshold.

8. A controller in communication with a memory apparatus including memory cells each connected to one of a plurality of word lines and configured to retain a threshold voltage corresponding to one of a plurality of data states, the controller configured to:

instruct the memory apparatus to apply verification pulses of a plurality of program verify voltages each associated with one of the plurality of data states to selected ones of the plurality of word lines and count the memory cells having the threshold voltage below each of the plurality of program verify voltages targeted for each of the memory cells being programmed during each of a plurality of verify loops of a program-verify operation; and instruct the memory apparatus to terminate the plurality of verify loops for the memory cells targeted for one of the plurality of data states in response to the count of the memory cells targeted for the one of the plurality of data states being greater than or equal to a predetermined count threshold, the predetermined count threshold being different for at least one of the plurality of data states compared to the predetermined count threshold for other ones of the plurality of data states, wherein the predetermined count threshold is individually adjustable for at least five data states of the plurality of data states.

9. The controller as set forth in claim 8, wherein the predetermined count threshold is individually adjustable for each of the plurality of data states.

10. The controller as set forth in claim 8, wherein the plurality of program verify voltages each associated with one of the plurality of data states includes both a verify low program verify voltage and a verify high program verify voltage associated with each of the plurality of data states, and the controller is further configured to instruct the memory apparatus to count the memory cells having the threshold voltage below the verify low program verify voltage associated with the each of the plurality of data states targeted for each of the memory cells being programmed during each of the plurality of verify loops of the program-verify operation.

11. The controller as set forth in claim 10, wherein the verify high program verify voltage is greater in magnitude than the verify low program verify voltage.

12. The controller as set forth in claim 10, wherein the predetermined count threshold for at least one of the plurality of data states is selected to compensate for different sensitivities of the memory cells targeted for at least one of the plurality of data states being verified during each of the plurality of verify loops of the program-verify operation using the verify low program verify voltage and the verify high program verify voltage compared to the memory cells targeted for other ones of the plurality of data states being verified during each of the plurality of verify loops of the program-verify operation using the verify low program verify voltage and the verify high program verify voltage.

13. The controller as set forth in claim 8, wherein the controller is further configured to instruct the memory apparatus to apply one of a plurality of pulses of a program voltage to the selected ones of the plurality of word lines prior to applying the verification pulses of the plurality of program verify voltages each associated with one of the plurality of data states to the selected ones of the plurality of word lines during the program-verify operation.

14. A method of operating a memory apparatus including memory cells each connected to one of a plurality of word lines and configured to retain a threshold voltage corresponding to one of a plurality of data states, the method comprising the steps of:

applying verification pulses of a plurality of program verify voltages each associated with one of the plurality of data states to selected ones of the plurality of word lines and counting the memory cells having the threshold voltage below each of the plurality of program verify voltages targeted for each of the memory cells being programmed during each of a plurality of verify loops of a program-verify operation; and terminating the plurality of verify loops for the memory cells targeted for one of the plurality of data states in response to the count of the memory cells targeted for the one of the plurality of data states being greater than or equal to a predetermined count threshold, the predetermined count threshold being different for at least one of the plurality of data states compared to the predetermined count threshold for other ones of the plurality of data states, wherein the predetermined count threshold is individually adjustable for at least five data states of the plurality of data states.

15. The method as set forth in claim 14, wherein the predetermined count threshold is individually adjustable for each of the plurality of data states.

16. The method as set forth in claim 14, wherein the plurality of program verify voltages each associated with one of the plurality of data states includes both a verify low program verify voltage and a verify high program verify voltage associated with each of the plurality of data states, and the method further includes the step of counting the memory cells having the threshold voltage below the verify low program verify voltage associated with the each of the plurality of data states targeted for each of the memory cells being programmed during each of the plurality of verify loops of the program-verify operation.

17. The method as set forth in claim 16, wherein the verify high program verify voltage is greater in magnitude than the verify low program verify voltage.

18. The method as set forth in claim 16, wherein the predetermined count threshold for at least one of the plurality of data states is selected to compensate for different sensitivities of the memory cells targeted for at least one of the plurality of data states being verified during each of the plurality of verify loops of the program-verify operation using the verify low program verify voltage and the verify high program verify voltage compared to the memory cells targeted for other ones of the plurality of data states being verified during each of the plurality of verify loops of the program-verify operation using the verify low program verify voltage and the verify high program verify voltage.

19. The method as set forth in claim 14, further including the step of applying one of a plurality of pulses of a program voltage to the selected ones of the plurality of word lines prior to applying the verification pulses of the plurality of program verify voltages each associated with one of the plurality of data states to the selected ones of the plurality of word lines during the program-verify operation.

20. The method as set forth in claim 14, wherein the each of the memory cells is configured to store three bits and the plurality of data states includes, in order of the threshold voltage increasing, in magnitude, an erase state and a first data state and a second data state and a third data state and fourth data state and a fifth data state and a sixth data state and a seventh data state, the predetermined count threshold for the first data state is a first predetermined count threshold and the predetermined count threshold for the second data state is a second predetermined count threshold and the predetermined count threshold for the third data state is a third predetermined count threshold and the predetermined count threshold for the fourth data state is a fourth predetermined count threshold and the predetermined count threshold for the fifth data state is a fifth predetermined count threshold and the predetermined count threshold for the sixth data state is a sixth predetermined count threshold and the predetermined count threshold for the seventh data state is a seventh predetermined count threshold.

* * * * *